(12) United States Patent  
Mitsumoto et al.

(10) Patent No.: US 7,338,746 B2  
(45) Date of Patent: *Mar. 4, 2008

(54) LITHOGRAPHIC PRINTING PLATE PRECURSOR AND LITHOGRAPHIC PRINTING METHOD

(75) Inventors: Tomoyoshi Mitsumoto, Shizuoka (JP); Satoshi Hoshi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/947,231

(22) Filed: Sep. 23, 2004

(65) Prior Publication Data

US 2005/0069811 A1    Mar. 31, 2005

(30) Foreign Application Priority Data

Sep. 24, 2003  (JP) .......................... P.2003-332131  
Aug. 31, 2004  (JP) .......................... P.2004-252304

(51) Int. Cl.  
*G03F 7/11*    (2006.01)  
*G03F 7/14*    (2006.01)

(52) U.S. Cl. .................... 430/273.1; 430/302; 430/964

(58) Field of Classification Search ............. 430/273.1, 430/302, 964  
See application file for complete search history.

(56) References Cited

U.S. PATENT DOCUMENTS

| | | | |
|---|---|---|---|
| 3,458,311 A | 7/1969 | Alles | |
| 5,677,110 A * | 10/1997 | Chia et al. | 430/302 |
| 6,258,510 B1 * | 7/2001 | Maemoto | 430/278.1 |
| 6,599,674 B1 * | 7/2003 | Kawamura | 430/270.1 |
| 2002/0177074 A1 * | 11/2002 | Hoshi et al. | 430/281.1 |
| 2003/0198893 A1 * | 10/2003 | Oshima | 430/273.1 |
| 2004/0197701 A1 * | 10/2004 | Mitsumoto et al. | 430/270.1 |
| 2005/0008971 A1 * | 1/2005 | Mitsumoto et al. | 430/270.1 |

FOREIGN PATENT DOCUMENTS

| | | | |
|---|---|---|---|
| EP | 1091251 | * | 4/2001 |
| EP | 1223196 A2 | | 7/2002 |
| EP | 1291718 A2 | | 3/2003 |
| JP | 11-38633 A | | 2/1999 |
| JP | 2938397 B2 | | 6/1999 |
| JP | 2000-39711 A | | 2/2000 |
| JP | 2001-277740 A | | 10/2001 |
| JP | 2001-277742 A | | 10/2001 |
| JP | 2002-287334 A | | 10/2002 |

OTHER PUBLICATIONS

Derwent abst. 1999-194682; Feb. 12, 1999; abst. of JP 11-038633.*  
JPAB abst of JP 11-038633; Kunita et al.; Feb. 12, 1999.*

* cited by examiner

*Primary Examiner*—Richard L. Schilling  
(74) *Attorney, Agent, or Firm*—Birch, Stewart, Koalasch & Birch, LLP

(57) ABSTRACT

A lithographic printing plate precursor comprising: a support; an image recording layer comprising (A) an actinic ray absorber, (B) a polymerization initiator, and (C) a polymerizable compound, wherein the image recording layer is capable of being removed with at least one of a printing ink and a fountain solution; and an overcoat layer comprising an inorganic laminar compound. And a lithographic printing method comprising: mounting a lithographic printing plate precursor on a printing press; imagewise exposing the lithographic printing plate precursor with laser beams; and feeding at least one of a printing ink and a fountain solution to the lithographic printing plate precursor to remove a laser beams non-exposed area in an image recording layer; and performing printing.

9 Claims, No Drawings

LITHOGRAPHIC PRINTING PLATE PRECURSOR AND LITHOGRAPHIC PRINTING METHOD

This Nonprovisional application claims priority under 35 U.S.C. § 119(a) on Patent Application No(s). 2003-332131 and 2004-252304 filed in Japan on Sep. 24, 2003 and Aug. 31, 2004, respectively, the entire contents of which are hereby incorporated by reference.

BACKGROUND OF THE INVENTION

1. Field of the Invention

The present invention relates to a lithographic printing plate precursor and a lithographic printing method for using the same. Specifically, the present invention relates to a lithographic printing plate precursor capable of so-called direct plate-making, i.e., capable of directly making a printing plate by scanning a lithographic printing plate precursor with laser beams on the basis of digital signals of, e.g., a computer, and a lithographic printing method of developing the lithographic printing plate precursor on a printing press and performing printing.

2. Description of the Related Art

A lithographic printing plate generally comprises a lipophilic image area that receives ink and a hydrophilic non-image area that receives a fountain solution in printing. Lithographic printing is a printing method of making difference in ink-adhering property on the surface of a lithographic printing plate with the lipophilic image area of the lithographic printing plate as the ink-receptive area and the hydrophilic non-image area as the fountain solution-receptive area (ink-repellent area) by making use of the natures of water and oily ink of repelling to each other, adhering ink only on the image area, and transferring the ink to the material to be printed, e.g., paper.

For manufacturing this lithographic printing plate, a lithographic printing plate precursor (a PS plate) comprising a hydrophilic support having provided thereon a lipophilic photosensitive resin layer (an image-recording layer) has so far been widely used. The lithographic printing plate is generally obtained by a plate-making method of exposing a lithographic printing plate precursor through an original image of a lith film and the like, and then, for leaving the area to become an image area of the image-recording layer, dissolving and removing other unnecessary image-recording layer with an alkali developing solution or an organic solvent, to thereby bare a hydrophilic support surface to form a non-image area.

In a related-art plate-making process of a lithographic printing plate precursor, a process of dissolving and removing unnecessary image-recording layer with a developing solution and the like after exposure is necessary, but the exclusion or simplification of such an additional wet process is one of the objects in the industry. Since the disposal of waste solutions discharged with wet processes is a particularly great interest in the industry at large in recent years from the consideration of the global environment, the solution of the above problem is increasingly desired.

As a simple plate-making method, a method that is called on-press development is proposed, which is a method of using an image-recording layer capable of removing an unnecessary area of a lithographic printing plate precursor in an ordinary printing process, and removing a non-image area after exposure on a printing press to obtain a lithographic printing plate.

As the specific examples of on-press development, e.g., a method of using a lithographic printing plate precursor having an image-recording layer soluble or dispersible with, e.g., a fountain solution, an ink solvent, or an emulsified product of a fountain solution and ink, a method of mechanically removing an image-recording layer by the contact with the rollers and the blanket of a press, and a method of mechanically removing an image-recording layer by the contact with the rollers and the blanket after weakening the cohesive strength of an image-recording layer or the adhesive strength of an image-recording layer and a support by the permeation of a fountain solution and an ink solvent are exemplified.

In the present invention, unless otherwise indicated, "development process" means a process of removing an unexposed area of an image-recording layer of a lithographic printing plate precursor by being brought into contact with a liquid (generally an alkali developing solution) to thereby bare the hydrophilic support surface with an apparatus other than a printing press (generally an automatic processor), and "on-press development" means a method and a process of removing an unexposed area of an image-recording layer of a lithographic printing plate precursor by being brought into contact with a liquid (generally printing ink and/or a fountain solution) to thereby bare the hydrophilic support surface with a printing press.

On the other hand, in recent years, digitized techniques of electronically processing, accumulating and outputting image data using a computer have prevailed, and various image output systems corresponding to these digitized techniques have been put to practical use. Under such circumstances, a computer-to-plate technique directly making a printing plate is attracting public attention, which comprises scanning exposing a lithographic printing plate precursor with high convergent radiant rays such as laser beams carrying digitized image data without using a lith film. With such a tendency, it is an important technical subject to obtain a lithographic printing plate precursor well adapted to this purpose.

Accordingly, in recent years, the simplification of plate-making operation, and the realization of dry system and non-processing system have been further strongly required from both aspects of the above-described global environmental protection and the adaptation for digitization.

As such a lithographic printing plate precursor, e.g., a lithographic printing plate precursor comprising a hydrophilic support having provided thereon an image-forming layer containing a hydrophobic thermoplastic polymer particles dispersed in a hydrophilic binder is known (refer to, e.g., Japanese Patent 2938397). After being subjected to exposure with an infrared laser and the hydrophobic thermoplastic polymer particles are fused and coalesced by heat and an image is formed, the lithographic printing plate precursor is attached to the cylinder of a printing press and subjected to on-press development by feeding water and/or a fountain solution.

However, such a method of forming an image by coalescence due to mere heat fusion of polymer particles certainly shows good on-press developing property, but image strength is extremely weak and press life is insufficient.

As the example of improving the press life of a lithographic printing plate precursor capable of on-press development, a lithographic printing plate precursor comprising a hydrophilic support having provided thereon a heat-sensitive layer containing microcapsules containing a compound having a heat reactive functional group, wherein the heat-sensitive layer or a contiguous layer to the heat-sensitive layer contains an infrared absorber, is suggested (refer to JP-A-2001-277740 and JP-A-2001-277742).

Further, as another technique for improving the press life, a lithographic printing plate precursor capable of on-press development which comprises a support having provided thereon a photosensitive layer containing an infrared absorber, a radical polymerization initiator and a polymerizable compound is known (refer to JP-A-2002-287334). Further, JP-A-2000-39711 discloses a lithographic printing plate precursor comprising an aluminum support and using on the aluminum support (a) a water-soluble or water-dispersible polymer, (b) a monomer or oligomer having a photopolymerizable ethylenic unsaturated double bond, and (c) a photosensitive composition containing a photopolymerization initiator having absorption maximum in the ultraviolet region, which lithographic printing plate precursor is capable of on-press development after exposure.

In these methods of using a reaction, e.g., a polymerization reaction, the density of chemical bonding of the image area is high as compared with the image area formed by the heat fusion of polymer fine particles, therefore it is possible to improve image strength. However, on-press development is not sufficiently compatible with fine line reproducibility and press life.

On the other hand, in an on-press development type lithographic printing plate, an overcoat layer (a protective layer) is generally provided on an image-recording layer for the purpose of preventing the generation of scratches, shielding oxygen, and preventing ablation by the exposure with high illuminance laser beams. Water-soluble polymer compounds excellent in crystallizability, e.g., polyvinyl alcohol, are used as the main component in the overcoat layer, but further improvements of on-press developability, fine line reproducibility, press life, and on-press development running properties (aptitudes, e.g., the mixing of the substances removed by on-press development in a fountain solution, and the accumulation of the substance on an impression cylinder in continuously repeating on-press development and printing) are required.

To cope with this problem, JP-A-11-38633 contrives the increase of sensitivity and the storage stability of a photosensitive material by using an inorganic laminar compound in an overcoat layer, but the photosensitive material disclosed in this patent is a negative image-recording material by alkali development, which is different from the material of the type for use in on-press development.

SUMMARY OF THE INVENTION

The present invention has been done in the light of the related-art, and the objects of the invention are to provide a lithographic printing plate precursor excellent in on-press developability, fine line reproducibility, press life and on-press development running properties, and a lithographic printing method using the same.

As a result of eager investigation to achieve the above objects, the present inventors have found the above objects can be achieved by using a specific inorganic laminar compound in an overcoat layer, thus the present invention has been achieved.

That is, the present invention is as follows.

(1) A lithographic printing plate precursor comprising:
a support;
an image recording layer comprising (A) an actinic ray absorber, (B) a polymerization initiator, and (C) a polymerizable compound, wherein the image recording layer is capable of being removed with at least one of a printing ink and a fountain solution; and
an overcoat layer comprising an inorganic laminar compound, in this order.

(2) A lithographic printing plate precursor comprising:
a support;
an undercoat layer comprising a compound having a polymerizable group;
an image recording layer comprising (A) an actinic ray absorber, (B) a polymerization initiator, and (C) a polymerizable compound, wherein the image recording layer is capable of being removed with at least one of a printing ink and a fountain solution; and
an overcoat layer comprising an inorganic laminar compound, in this order.

(3) The lithographic printing plate precursor as described in (1) or (2) above,
wherein the actinic ray absorber is an infrared absorber.

(4) The lithographic printing plate precursor as described in any of (1) to (3) above,
wherein the inorganic laminar compound is a swellable inorganic laminar compound.

(5) A lithographic printing method comprising:
mounting a lithographic printing plate precursor according to any of (1) to (4) above on a printing press;
imagewise exposing the lithographic printing plate precursor with an infrared laser beam; and
feeding at least one of a printing ink and a fountain solution to the lithographic printing plate precursor to remove an infrared non-exposed area in the image recording layer.

(6) The lithographic printing method described in (5) above,
wherein the mounting is performed before the imagewise exposing.

(7) The lithographic printing method described in (5) above,
wherein the mounting is performed after the imagewise exposing.

(8) A lithographic printing method comprising:
mounting a lithographic printing plate precursor according to any of (1) to (4) above on a printing press;
imagewise exposing the lithographic printing plate precursor with an ultraviolet laser beam having a wavelength of from 250 to 420 nm; and
feeding at least one of a printing ink and a fountain solution to the lithographic printing plate precursor to remove an ultraviolet non-exposed area in the image recording layer.

(9) The lithographic printing method described in (8) above,
wherein the mounting is performed before the imagewise exposing.

(10) The lithographic printing method described in (8) above,
wherein the mounting is performed after the imagewise exposing.

In the present invention, it is noted that the mounting of the lithographic printing plate precursor to the printing press may be performed either before or after the imagewise exposing of the lithographic printing plate precursor.

DETAILED DESCRIPTION OF THE INVENTION

The present invention is described in detail below.

In the first place, an overcoat layer for use in the lithographic printing plate precursor in the invention is described.

Overcoat Layer:

The inorganic laminar compound contained in an overcoat layer in the lithographic printing plate precursor of the invention comprises thin tabular particles, such as a mica group, e.g., natural mica and synthetic mica represented by following formula, $A(B, C)^{2-5}D_4O_{10}(OH, F, O)_2$ (wherein A represents any of K, Na and Ca, B and C represent any of Fe(II), Fe(III), Mn, Al, Mg and V, and D represents Si or Al), and talc, taeniolite, montmorillonite, saponite, hectorite and zirconium phosphate represented by formula $3MgO.4SiO.H_2O$ are exemplified.

In the above mica group, the examples of natural micas include white mica, paragonite, phlogopite, biotite and lepidolite. The examples of synthetic micas include non-swellable micas, e.g., fluorine phlogopite $KMg_3(AlSi_3O_{10})F_2$ and potassium tetrasilicate mica $KMg_{2.5}(Si_4O_{10})F_2$, and swellable micas, e.g., Na tetrasililic mica $NaMg_{2.5}(Si_4O_{10})F_2$, Na or Li taeniolite $(Na, Li)Mg_2Li(Si_4O_{10})F_2$, and montmorillonite-based Na or Li hectorite $(Na, Li)_{1/8}Mg_{2/5}Li_{1/8}(Si_4O_{10})F_2$. Synthetic smectites are also useful.

Of the above inorganic laminar compounds, fluorine-based swellable micas, which are synthetic inorganic laminar compounds, are preferably used in the invention. That is, these swellable synthetic micas and swellable clay minerals, e.g., montmorillonite, saponite, hectorite and bentonite, have a lamination structure comprising unit crystal lattice layers having a thickness of from 10 to 15 Å or so, and metallic atom substitution in the lattice is extremely great as compared with other clay minerals. As a result, there is an insufficient quantity of positive electric charge in the lattice layers, and cations such as $Na^+$, $Ca^{2+}$ and $Mg^{2+}$, are adsorbed among layers to compensate for the insufficiency. The cations intervening lattice layers are called exchangeable cations and they are exchangeable with various cations. Particularly when the cations among layers are $Li^+$ and $Na^+$, they are small in ionic radius, so that bonding among layer crystal lattices is weak and greatly swelled by water. When shear is applied in that state, the layers easily cleave and form stable sol in water. Bentonite and swellable synthetic micas have the tendency markedly, so that useful in the invention, and swellable synthetic micas are particularly preferably used.

As the shape of the inorganic laminar compounds for use in the invention, the thinner the thickness is the better from the viewpoint of the control of diffusion, and the bigger the plane size is the better so long as the smoothness of the coated surface and the transmission of actinic rays are not hindered. Accordingly, the aspect ratio of inorganic laminar compounds is preferably 20 or higher, preferably 100 or higher, and particularly preferably 200 or higher. The aspect ratio is the ratio of the thickness to the long diameter of a particle, and this can be measured, for example, from the projection drawing by the microphotograph of a particle. The greater the aspect ratio, the greater effect is obtained.

The average long diameter of the particle of inorganic laminar compounds for use in the invention is from 0.3 to 20 µm, preferably from 0.5 to 10 µm, and particularly preferably from 1 to 5 µm. The average thickness of the particle is 0.1 µm or less, preferably 0.05 µm or less, and particularly preferably 0.01 µm or less. For instance, of the inorganic laminar compounds, the thickness of swellable synthetic mica, which is a representative compound, is from 1 to 50 nm, and the face size is from 1 to 20 µm or so.

When the particles of inorganic laminar compounds having such a high aspect ratio are contained in an overcoat layer, the film strength is improved and the permeation of oxygen and moisture can be effectively prevented, hence the deterioration of the overcoat layer due to deformation and the like can be restrained. Therefore, even when the lithographic printing plate precursor is preserved under a high moisture condition for a long period of time, the lithographic printing plate precursor is free from the degradation of image-forming property due to moisture change and excellent storage stability can be ensured.

An inorganic laminar compound is contained in the overcoat layer is preferably in mass ratio of 5/1 to 1/100 to the amount of the binder used in the overcoat layer. Even when a plurality of inorganic laminar compounds are used in combination, it is preferred that the total amount of these inorganic laminar compounds be in the above mass ratio.

Exposure is generally performed in the air in the present invention, and the overcoat layer prevents the mixing of low molecular compounds such as oxygen in the air and basic substances into the image-recording layer, by which the hindrance of the image-forming reaction in the image-recording layer due to exposure in the air can be prevented. Accordingly, the characteristics required of the overcoat layer are to be low in permeability of low molecular weight compounds such as oxygen, good in transmission of light used as a light source, excellent in adhesion with an image-recording layer, and capable of being removed easily by on-press development after exposure. Overcoat layers having such characteristics have so far been variously examined and disclosed in detail, e.g., in U.S. Pat. No. 3,458,311 and JP-B-55-49729 (the term "JP-B" as used herein refers to an "examined Japanese patent publication").

It is preferred to use a binder together with the above inorganic laminar compound in the overcoat layer.

As the binders, any binders can be used with no particular limitation so long as they can form a uniform film adhering to an image-recording layer, and any of water-soluble polymers and water-insoluble polymers can be arbitrarily selected and used. The specific examples of the binders include polymers, e.g., polyvinyl alcohol, modified polyvinyl alcohol, polyvinyl pyrrolidone, polyvinyl imidazole, polyacrylic acid, polyacrylamide, a partial saponification product of polyvinyl acetate, ethylene-vinyl alcohol copolymers, water-soluble cellulose derivatives, gelatin, starch derivatives and gum arabic, and water-insoluble polymers, e.g., polyvinylidene chloride, poly(meth)acrylonitrile, polysulfone, polyvinyl chloride, polyethylene, polycarbonate, polystyrene, polyamide and cellophane. These polymers can be used in combination of two or more, if necessary.

Of these compounds, for easiness of removal of overcoat layer remaining in the non-image area and handling property at film forming time, water-soluble polymers, e.g., polyvinyl alcohol, polyvinyl pyrrolidone, polyvinyl imidazole, water-soluble acrylic resin such as polyacrylic acid, gelatin and gum arabic are preferably used. Above all, for capable of coating with water as the solvent and easiness of removal with the fountain solution at printing, polyvinyl alcohol, polyvinyl pyrrolidone, gelatin and gum arabic are more preferably used.

Polyvinyl alcohols for use in the overcoat layer in the invention may be partially substituted with ester, ether and acetal so long as they contain a substantial amount of unsubstituted vinyl alcohol units having necessary water solubility. Also, a part of polyvinyl alcohols may contain other copolymer components. As the specific examples of polyvinyl alcohols, those having a hydrolysis degree of 71 to 100 mol % and a polymerization degree of from 300 to 2,400 are exemplified.

Specifically, the examples include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 all manufactured by Kuraray Co., Ltd. As other copolymer components, polyvinyl acetate chloroacetate, propionate, polyvinyl formal and polyvinyl acetal, and copolymers thereof having a hydrolysis degree of from 88 to 100 mol % are exemplified.

General methods of dispersing an inorganic laminar compound for use in an overcoat layer are described. In the first place, from 5 to 10 mass parts of a swellable inorganic laminar compound exemplified above as preferred example is added to 100 mass parts of water, made thoroughly intimate with water to swell, and then dispersed with a disperser. As the dispersers used here, various kinds of mills of directly applying force mechanically to effect dispersion, high speed stirring type dispersers having great shearing force, and dispersers providing ultrasonic energy of high strength are exemplified. Specifically, a ball mill, a sand grinder mill, a visco mill, a colloid mill, a homogenizer, a dissolver, a Polytron, a homomixer, a homoblender, a KD mill, a JET AJITER, a capillary emulsifier, a liquid siren, an electromagnetic distortion type ultrasonic generator, and an emulsifier having a Poleman whistle are exemplified. The dispersion containing 5 to 10 mass parts swellable inorganic laminar compound is highly viscous or gel and storage stability is conspicuously excellent. When an overcoat layer coating solution is prepared using the dispersion, it is preferred to dilute the dispersion with water and stir thoroughly, and then blend with a binder solution.

Well-known additives, e.g., surfactants for increasing a coating property and water-soluble plasticizers for improving physical properties can be added to the overcoat layer coating solution. As the water-soluble plasticizers, e.g., propionamide, cyclohexanediol, glycerol and sorbitol are exemplified. Water-soluble (meth)acrylate polymers can also be added. Further, well-known additives for improving the adhesion with the image-recording layer and the aging stability of the coating solution may be added to the coating solution.

The thus-prepared overcoat layer coating solution is coated on the image-recording layer provided on the support and dried to form an overcoat layer. A coating solvent can be arbitrarily selected in the relationship with the binder. When water-soluble polymers are used, it is preferred to use distilled water and purified water as the coating solvent. The coating method of the overcoat layer is not particularly restricted and well-known methods, e.g., the coating methods disclosed in U.S. Pat. No. 3,458,311 and JP-B-55-49729 can be used. Specifically, the overcoat layer is coated with blade coating, air knife coating, gravure coating, roll coating, spray coating, dip coating or bar coater coating.

The coating weight of the overcoat layer is preferably from 0.01 to 10 g/m$^2$ in dry weight, more preferably from 0.02 to 3 g/m$^2$ in dry weight, and most preferably from 0.02 to 1 g/m$^2$ in dry weight.

Image-Recording Layer:

An image-recording layer for use in the lithographic printing plate precursor in the invention is described in detail below.

The lithographic printing plate precursor in the invention comprises a support having provided thereon an image recording layer containing (A) an actinic ray absorber, (B) a polymerization initiator, and (C) a polymerizable compound, and is capable of being removed with printing ink or a fountain solution, or both of them.

Each component constituting an image-recording layer is described in detail below.

(A) Actinic Ray Absorber:

Actinic ray absorbers for use in the invention are compounds that absorb light radiated from the exposure light source, efficiently generate radicals from a polymerization initiator by a photon mode and/or a heat mode, and contribute to the improvement of sensitivity of a lithographic printing plate. As such actinic ray absorbers, infrared absorbers are preferably used when the lithographic printing plate precursor is imagewise exposed with an infrared laser, and sensitizing dyes absorbing lights of the wavelength of from 250 to 420 nm are preferably used when the lithographic printing plate precursor is imagewise exposed with an ultraviolet laser.

Infrared Absorber:

These infrared absorbers for use in the invention are dyes or pigments having an absorption maximum preferably in the wavelength of from 760 to 1,200 nm.

As dyes for this purpose, commercially available dyes and well-known dyes described in documents, e.g., Senryo Binran (Dye Handbook), compiled by Yuki Gosei Kagaku Kyokai (1970) can be used. Specifically, azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalylium dyes, pyrylium salts and metal thiolate complexes are exemplified. As preferred dyes, e.g., the cyanine dyes disclosed in JP-A-58-125246, JP-A-59-84356 and JP-A-60-78787, the methine dyes disclosed in JP-A-58-173696, JP-A-58-181690 and JP-A-58-194595, the naphthoquinone dyes disclosed in JP-A-58-112793, JP-A-58-224793, JP-A-59-48187, JP-A-59-73996, JP-A-60-52940 and JP-A-60-63744, the squalylium dyes disclosed in JP-A-58-112792, and the cyanine dyes disclosed in British Patent 434,875 are exemplified.

Further, the near infrared-absorbing sensitizers disclosed in U.S. Pat. No. 5,156,938 are also preferably used, in addition, the substituted arylbenzo(thio)pyrylium salts disclosed in U.S. Pat. No. 3,881,924, the trimethine thiapyrylium salts disclosed in JP-A-57-142645 (corresponding to U.S. Pat. No. 4,327,169), the pyrylium-based compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethine thiopyrylium salts disclosed in U.S. Pat. No. 4,283,475, and the pyrylium compounds disclosed in JP-B-5-13514 and JP-B-5-19702 are also preferably used in the present invention. As other examples of preferred dyes, the near infrared-absorbing dyes disclosed in U.S. Pat. No. 4,756,993 as the compounds represented by formulae (I) and (II) can be exemplified.

Of these dyes, a cyanine dye, a squalylium dye, a pyrylium salt, a nickel thiolate complex and an indolenine cyanine dye are very preferred. A cyanine dye and an indolenine cyanine dye are more preferred, and a cyanine dye represented by the following formula (i) is particularly preferred.

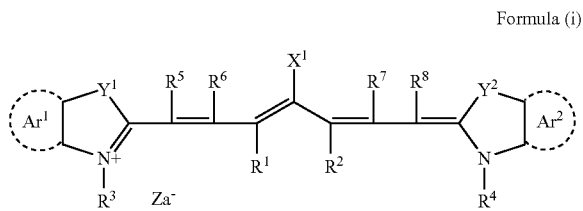

Formula (i)

In formula (i), $X^1$ represents a hydrogen atom, a halogen atom, —$NPh_2$, $X^2$-$L^1$, or the following shown group.

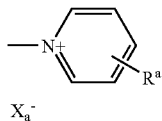

$X^2$ in formula (i) represents an oxygen atom, a nitrogen atom or a sulfur atom; and $L^1$ represents a hydrocarbon group having from 1 to 12 carbon atoms, an aromatic ring having a hetero atom, or a hydrocarbon group containing a hetero atom and having from 1 to 12 carbon atoms. The hetero atoms used show N, S, O, a halogen atom and Se. $X_a^-$ is defined as the same with the later-described $Z_a^-$, $R^a$ represents a substituent selected from a hydrogen atom, an alkyl group, an aryl group, a substituted or unsubstituted amino group and a halogen atom, and Ph represents a phenyl group.

$R^1$ and $R^2$ in formula (i) each represents a hydrocarbon group having from 1 to 12 carbon atoms. In view of the storage stability of a recording layer coating solution, $R^1$ and $R^2$ each preferably represents a hydrocarbon group having 2 or more carbon atoms, and particularly preferably $R^1$ and $R^2$ are bonded to each other to form a 5- or 6-membered ring.

$Ar^1$ and $Ar^2$, which may be the same or different, each represents an aromatic hydrocarbon group which may have a substituent. The examples of preferred aromatic hydrocarbon groups include a benzene ring and a naphthalene ring. The preferred examples of the substituents include a hydrocarbon group having 12 or less carbon atoms, a halogen atom, and an alkoxyl group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. The preferred examples of the substituents include an alkoxyl group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms, preferably a hydrogen atom because of easy availability of the material. $Z_a^-$ represents a counter anion, provided that when a cyanine dye represented by formula (i) has an anionic substituent within the structure and the neutralization of the electric charge is not necessary, $Z_a^-$ is not necessary. $Z_a^-$ preferably represents a halogen ion, a perchlorate ion, a tetrafluoroborate ion, a hexafluorophosphate ion or a sulfonate ion for the storage stability of the recording layer coating solution, and particularly preferably, a perchlorate ion, a hexafluorophosphate ion or an arylsulfonate ion.

As the specific examples of a cyanine dye represented by formula (i) that can be preferably used in the invention, those disclosed in JP-A-2001-133969, paragraphs [0017] to [0019] are exemplified.

Further, as particularly preferred other examples, the indolenine cyanine dyes disclosed in JP-A-2002-278057 are exemplified.

Infrared absorbers are preferably water-soluble, but water-insoluble infrared absorbers can also be used by means of dispersion or dissolution in a mixed solvent.

As the pigments which are used in the present invention, commercially available pigments and the pigments described in Color Index (C.I.) Binran (Color Index Bulletin), Saishin Ganryo Binran (The Latest Pigment Handbook), compiled by Nippon Ganryo Gijutsu Kyokai (1977), Saishin Ganryo Oyo Gijutsu (The Latest Pigment Applied Techniques), CMC Publishing Co. Ltd. (1986), Insatsu Ink Gijutsu (Printing Ink Techniques), CMC Publishing Co. Ltd. (1984) can be used.

Various kinds of pigments can be used in the invention, e.g., black pigments, yellow pigments, orange pigments, brown pigments, red pigments, purple pigments, blue pigments, green pigments, fluorescent pigments, metallic powder pigments, and polymer-bond pigments can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments, and carbon black can be used. Of these pigments, carbon black is preferably used.

These pigments can be used without surface treatment or may be surface-treated. As the methods of surface treatments, a method of coating the surfaces of pigments with resins and waxes, a method of adhering surfactants, and a method of bonding reactive substances (e.g., silane coupling agents, epoxy compounds, or polyisocyanate) on the surfaces of pigments can be exemplified. These surface treatment methods are described in Kinzoku Sekken no Seishitsu to Oyo (Natures and Applications of Metal Soaps), Saiwai Shobo-Co., Ltd., Insatsu Ink Gijutsu (Printing Ink Techniques), CMC Publishing Co., Ltd. (1984), and Saishin Ganryo Oyo Gijutsu (The Latest Pigment Applied Techniques), CMC Publishing Co., Ltd. (1986).

The particle size of pigments is preferably from 0.01 to 10 μm, more preferably from 0.05 to 1 μm, and particularly preferably from 0.1 to 1 μm. When the particle size of pigments is in this range, stability of the pigment dispersion in an image-recording layer and uniformity of an image-recording layer can be obtained.

Well-know dispersing methods used in the manufacture of inks and toners can be used as the dispersing methods of pigments. The examples of dispersing apparatus include an ultrasonic disperser, a sand mill, an attritor, a pearl mill, a super-mill, a ball mill, an impeller, a disperser, a KD mill, a colloid mill, a dynatron, a three-roll mill and a pressure kneader, and details are described in Saishin Ganryo Oyo Gijutsu (The Latest Pigment Applied Techniques), CMC Publishing Co., Ltd. (1986).

It is preferred that the addition amount of infrared absorbers to an image-recording layer be the necessary minimum amount for restraining the side reactions hindering the polymerization reaction.

Infrared absorbers can be used in an amount of from 0.001 to 50% by weight to the total solids content in the image-recording layer, preferably from 0.005 to 30% by weight, and particularly preferably from 0.01 to 10% by weight. When the amount of infrared absorbers is in this range, high sensitivity can be obtained without exerting unfavorable influence upon the uniformity and layer strength of an image-recording layer.

Of the above-described infrared absorbers, a cyanine dye represented by formula (i) is preferred.

Sensitizing Dye:

Sensitizing dyes for use in the invention are compounds having absorption in the range of the wavelengths of from 250 to 420 nm. The specific examples of the sensitizing dyes include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino)phenyl styryl ketone, p-(dimethylamino)phenyl p-methyl styryl ketone, benzophenone, p-(dimethylamino) benzophenone (or Michler's ketone), p-(diethylamino)benzophenone, and benzanthrone.

Further, as a sensitizing dye preferably used in the invention, a compound represented by formula (ii) disclosed in JP-B-51-48516 is exemplified.

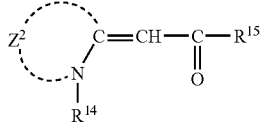

(ii)

In formula (ii), $R^{14}$ represents an alkyl group (e.g., a methyl group, an ethyl group, a propyl group), or a substituted alkyl group (e.g., a 2-hydroxyethyl group, a 2-methoxyethyl group, a carboxymethyl group, a 2-carboxyethyl group); $R^{15}$ represents an alkyl group (e.g., a methyl group, an ethyl group), or an aryl group (e.g., a phenyl group, a p-hydroxyphenyl group, a naphthyl group, a thienyl group).

$Z^2$ represents a non-metallic atomic group necessary to form a heterocyclic nucleus containing a nitrogen atom generally used in cyanine dyes, e.g., benzothiazoles (e.g., benzothiazole, 5-chlorobenzothiazole, 6-chlorobenzothiazole), naphthothiazoles (e.g., α-naphthothiazole, β-naphthothiazole), benzoselenazoles (e.g., benzoselenazole, 5-chlorobenzoselenazole, 6-methoxybenzoselenazole), naphthoselenazoles (e.g., α-naphthoselenazole, β-naphthoselenazole), benzoxazoles (e.g., benzoxazole, 5-methylbenzoxazole, 5-phenylbenzoxazole), and naphthoxazoles (e.g., α-naphthoxazole, β-naphthoxazole).

The specific examples of the compounds represented by formula (ii) have chemical structures in which $Z^2$, $R^{14}$ and $R^{15}$ are variously combined, and many compounds are present as well-known compounds. Accordingly, the compounds represented by formula (ii) can be arbitrarily selected from well-known compounds. As the preferred sensitizing dyes in the present invention, the merocyanine dyes disclosed in JP-B-5-47095 and the ketocoumarin-based compounds represented by the following formula (iii) are also exemplified.

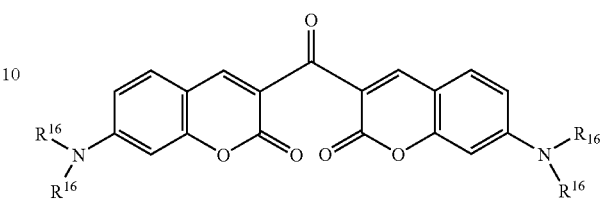

(iii)

wherein $R^{16}$ represents an alkyl group, e.g., a methyl group or an ethyl group.

The merocyanine dyes disclosed in JP-A-2000-147763 can also be used as a sensitizing dye. The sensitizing dyes disclosed in JP-A-2001-100412 can also be preferably used. The specific examples are shown below.

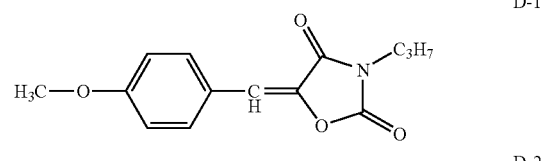

D-1

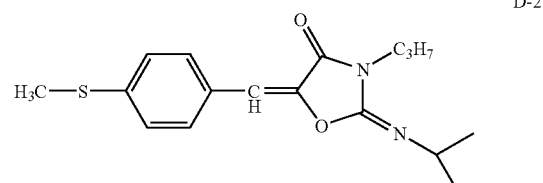

D-2

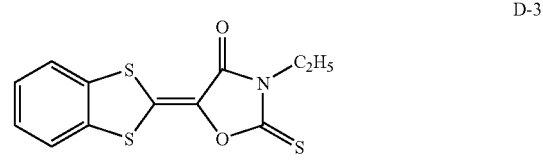

D-3

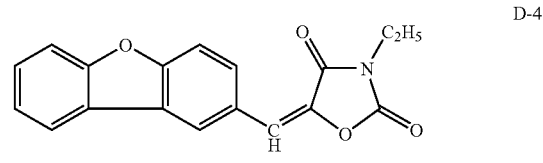

D-4

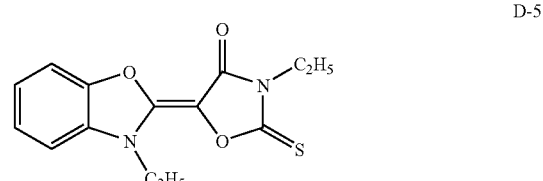

D-5

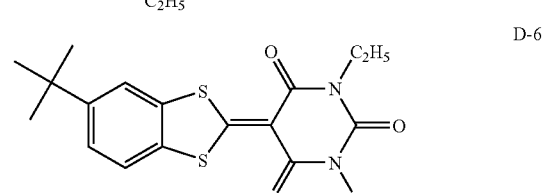

D-6

-continued

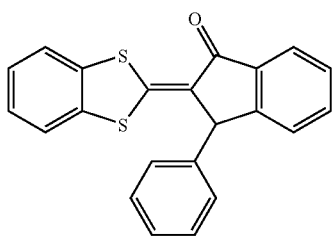
D-7

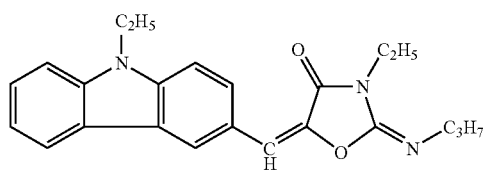
D-8

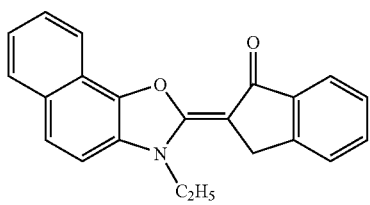
D-9

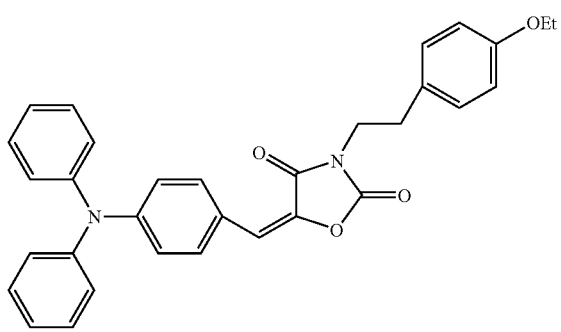
D-10

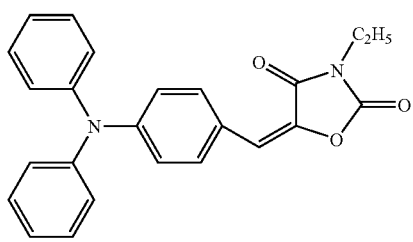
D-11

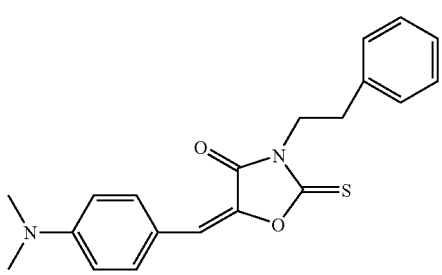
D-12

-continued

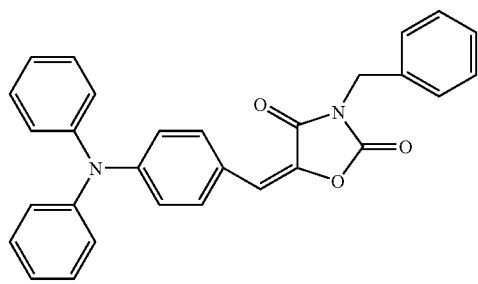
D-13

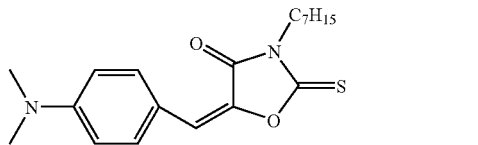
D-14

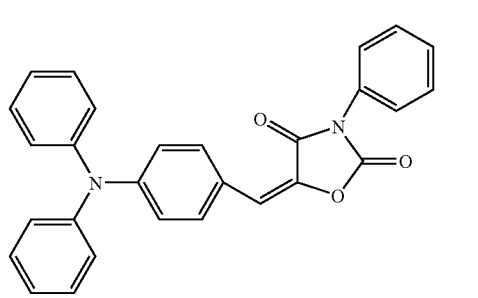
D-15

Sensitizing dyes are preferably used in an amount of from 0.1 to 50% by weight to the total solids content constituting the image-recording layer, more preferably from 0.5 to 30% by weight, and particularly preferably from 0.8 to 20% by weight.

(B) Polymerization Initiator:

A polymerization initiator that can be used in the invention is a compound capable of generating radicals by light, heat or both energies and initiates and accelerates polymerization of a compound having a polymerizable unsaturated group. As the polymerization initiators that can be used in the invention, well-known thermal polymerization initiators, compounds having small bond-dissociating energy, and photopolymerization initiators are exemplified.

As such polymerization initiators, e.g., organic halogen compounds, carbonyl compounds, organic peroxides, azo-based polymerization initiators, azide compounds, metallocene compounds, hexaarylbiimidazole compounds, organic boron compounds, disulfone compounds, oxime ester compounds, oxime ether compounds and onium salt compounds are exemplified.

As the organic halogen compounds, specifically, the compounds described in Wakabayashi et al., Bull. Chem. Soc. Japan, 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, Journal of Heterocyclic Chemistry, 1 (No. 3) (1970) are exemplified. Of these compounds, oxazole compounds substituted with a trihalomethyl group and s-triazine compounds are preferably used.

More preferably, s-triazine derivatives in which at least one mono-, di- or tri-halogen-substituted methyl group is substituted on the s-triazine ring, specifically, e.g., 2,4,6-tris (monochloromethyl)-s-triazine, 2,4,6-tris-(dichloromethyl)-s-triazine, 2,4,6-tris(trichloromethyl)-s-triazine, 2-methyl-4, 6-bis(trichloromethyl)-s-triazine, 2-n-propyl-4,6-bis (trichloromethyl)-s-triazine, 2-(α,α,β-trichloroethyl)-4,6-bis(trichloromethyl)-s-triazine, 2-phenyl-4,6-bis (trichloromethyl)-s-triazine, 2-(p-methoxy-phenyl)-4,6-bis (trichloromethyl)-s-triazine, 2-(3,4-epoxy-phenyl)-4,6-bis (trichloromethyl)-s-triazine, 2-(p-chloro-phenyl)-4,6-bis (trichloromethyl)-s-triazine, 2-[1-(p-methoxyphenyl)-2,4-butadienyl]-4,6-bis(trichloromethyl)-s-triazine, 2-styryl-4, 6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis (trichloromethyl)-s-triazine, 2-(4-methoxynaphthyl)-4,6-bis (trichloromethyl)-s-triazine, 2-phenylthio-4,6-bis (trichloromethyl)-s-triazine, 2-benzyl-thio-4,6-bis (trichloromethyl)-s-triazine, 2-[4-(p-hydroxy-benzoylamino)phenyl]-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine are exemplified.

As the carbonyl compounds, benzophenone derivatives, e.g., benzophenone, Michler's ketone, 2-methylbenzophenone, 3-methylbenzophenone, 4-methylbenzophenone, 2-chlorobenzo-phenone, 4-bromobenzophenone, and 2-carboxybenzophenone, acetophenone derivatives, e.g., 2,2-dimethoxy-2-phenyl-acetophenone, 2,2-diethoxyacetophenone, 1-hydroxycyclohexyl phenyl ketone, α-hydroxy-2-methylphenylpropanone, 1-hydroxy-1-methylethyl-(p-isopropylphenyl) ketone, 1-hydroxy-1-(p-dodecylphenyl) ketone, 2-methyl-[4'-(methylthio)phenyl]-2-morpholino-1-prop anone, and 1,1,1-trichloromethyl-(p-butyl-phenyl) ketone, thioxanthone derivatives, e.g., thioxanthone, 2-ethylthioxanthone, 2-isopropylthioxanthone, 2-chloro-thioxanthone, 2,4-dimethylthioxanthone, 2,4-diethylthio-xanthone, and 2,4-diisopropylthioxanthone, and benzoate derivatives, e.g., ethyl p-dimethylaminobenzoate and ethyl p-diethylaminobenzoate are exemplified.

As the azo compounds, the azo compounds disclosed in JP-A-8-108621 are exemplified.

As the organic peroxides, e.g., trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)-hexane, 2,5-oxanoyl peroxide, succinic acid peroxide, benzoyl peroxide, 2,4-dichlorobenzoyl peroxide, diisopropylperoxy dicarbonate, di-2-ethylhexylperoxy dicarbonate, di-2-ethoxy-ethylperoxy dicarbonate, dimethoxyisopropylperoxy carbonate, di(3-methyl-3-methoxybutyl)peroxy dicarbonate, tert-butyl-peroxy acetate, tert-butylperoxy pivalate, tert-butylperoxy neodecanoate, tert-butylperoxy octanoate, tert-butylperoxy laurate, tersyl carbonate, 3,3',4,4'-tetra(t-butylperoxy-carbonyl)benzophenone, 3,3',4,4'-tetra(t-hexylperoxy-carbonyl)benzophenone, 3,3',4,4'-tetra(p-isopropylcumyl-peroxycarbonyl)benzophenone, carbonyldi (t-butylperoxy-dihydrogendiphthalate), and carbonyldi(t-hexylperoxy-dihydrogendiphthalate) are exemplified.

As the metallocene compounds, various titanocene compounds disclosed in JP-A-59-152396, JP-A-61-151197, JP-A-63-41484, JP-A-2-249, JP-A-2-4705 and JP-A-5-83588, e.g., dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4, 6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5, 6-tetrafluorophen-1-yl, dimethylcyclopentadienyl-Ti-bis-2, 3,4,5,6-pentafluorophen-1-yl, bis(cyclopentadienyl)-bis[2, 6-difluoro-3-(pyr-1-yl)phenyl]titanium, and the iron-arene complexes disclosed in JP-A-1-304453 and JP-A-1-152109 are exemplified.

As the hexaarylbiimidazole compounds, various compounds disclosed in JP-B-6-29285, U.S. Pat. Nos. 3,479, 185, 4,311,783 and 4,622,286, specifically, e.g., 2,2'-bis(o-chlorophenyl)-4,4',5,5'-tetraphenylbiimidazole, 2,2'-bis(o-bromophenyl)-4,4,4',5,5'-tetraphenylbiimidazole, 2,2'-bis(o, p-dichloro-phenyl)-4,4',5,5'-tetraphenylbiimidazole, 2,2'-bis-(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4', 5,5'-tetraphenylbiimidazole are exemplified.

As the organic boron compounds, e.g., the organic borates disclosed in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539, and Kunz, Martin, "Rad Tech '98 Proceeding Apr. 19-22, 1998, Chicago", the organic boron sulfonium complexes or the organic boron oxosulfonium complexes disclosed in JP-A-6-157623, JP-A-6-175564 and JP-A-6-175561, the organic boron iodonium complexes disclosed in JP-A-6-175554 and JP-A-6-175553, the organic boron phosphonium complexes disclosed in JP-A-9-188710, and organic boron transition metal coordination complexes disclosed in JP-A-6-348011, JP-A-7-128785, JP-A-7-140589, JP-A-7-306527 and JP-A-7-292014 are exemplified.

As the disulfone compounds, the compounds disclosed in JP-A-61-166544 and JP-A-2003-328465 are exemplified.

As the oxime ester compounds, the compounds described in J. C. S. Perkin II, 1653-1660 (1979), J. C. S. Perkin II, 156-162 (1979), Journal of Photopolymer Science and Technology, pp. 202-232 (1995), JP-A-2000-66385, the compounds disclosed in JP-A-2000-80068, specifically the compounds shown below are exemplified.

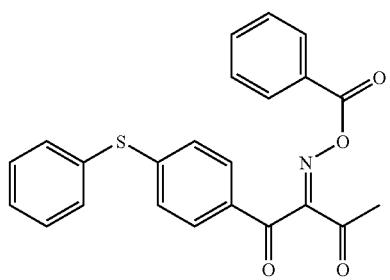

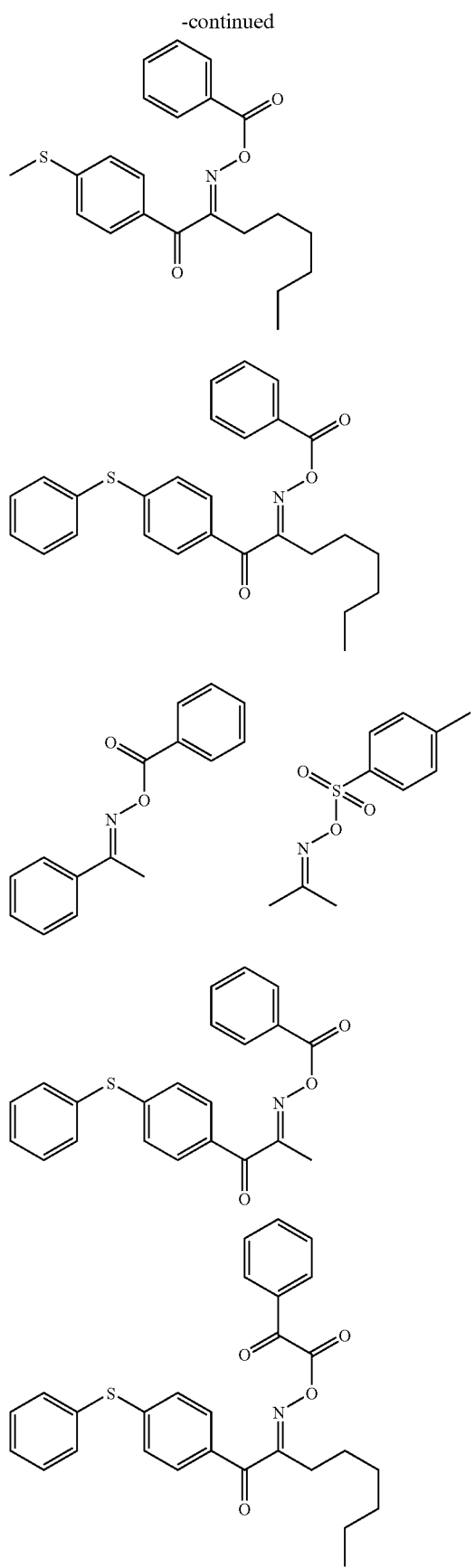
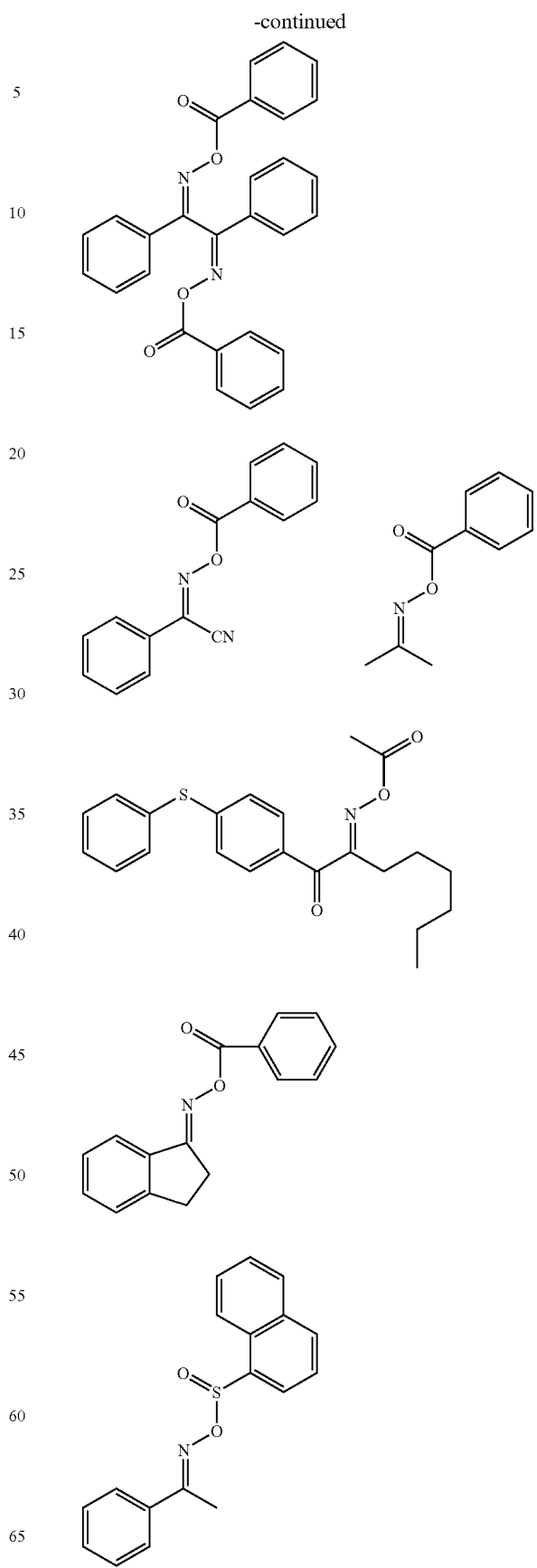

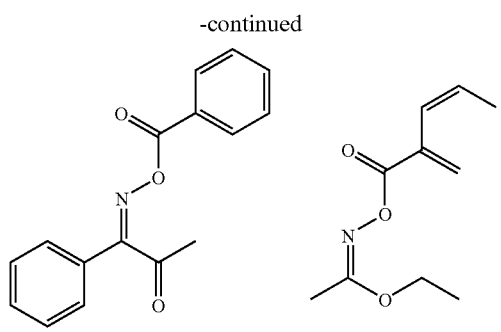
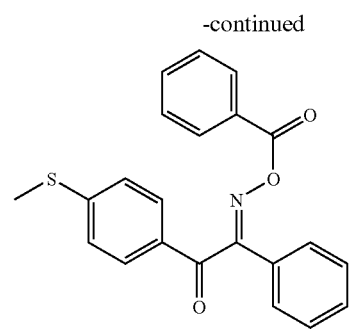
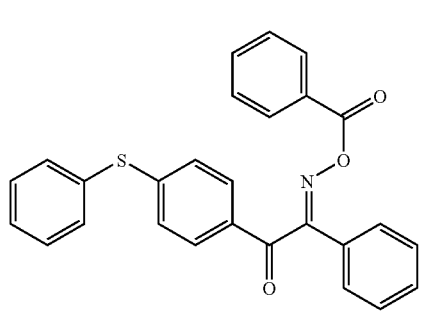
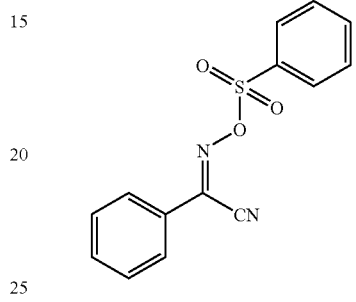
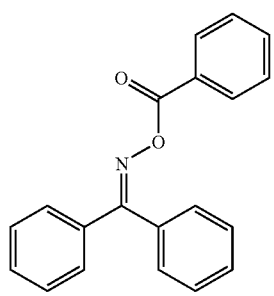
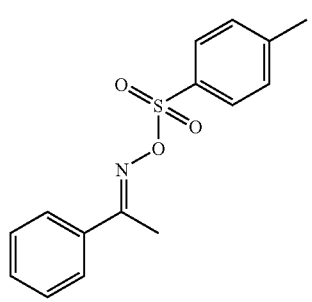
As the oxime ether compounds, the compounds disclosed in JP-A-8-202035 and JP-A-10-237118 are exemplified. As the specific examples, the compounds represented by the following structural formulae are exemplified.
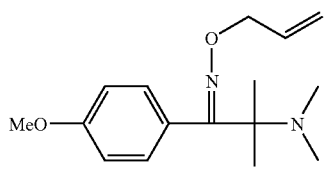
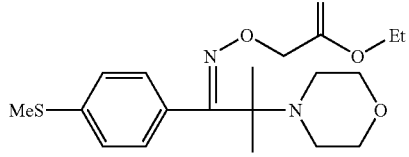
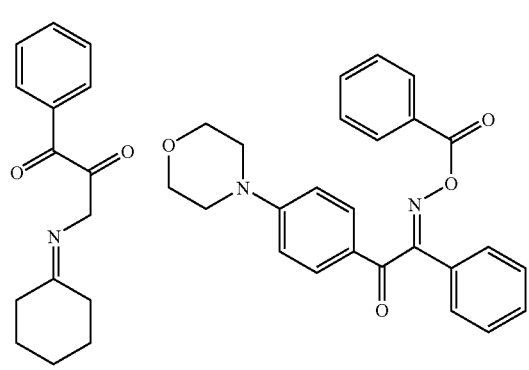
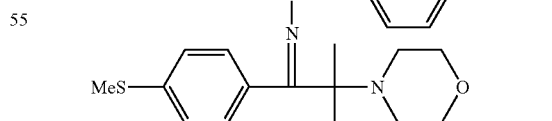
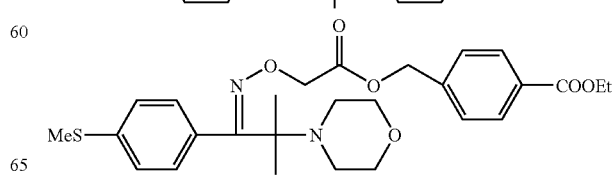

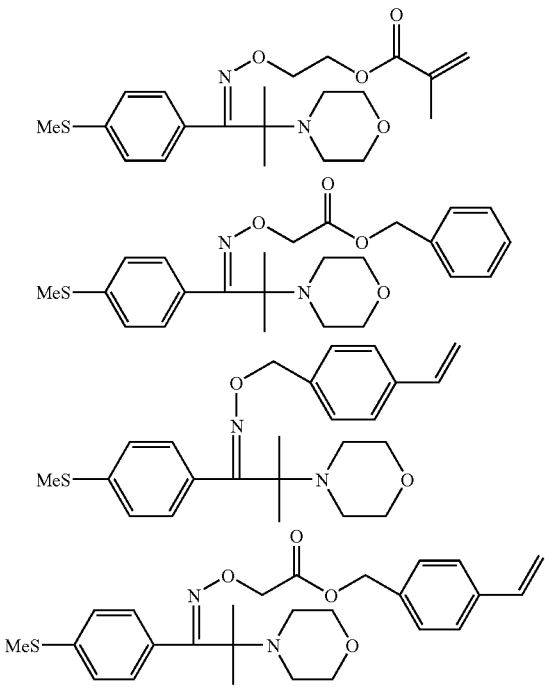

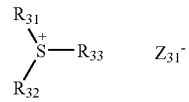

(RI-III)

As the onium salt compounds, onium salts, e.g., the diazonium salts described in S. I. Schlesinger, Photogr. Sci. Eng., 18, 387 (1974), and T. S. Bal et al., Polymer, 21, 423 (1980), the ammonium salts disclosed in U.S. Pat. No. 4,069,055 and JP-A-4-365049, the phosphonium salts disclosed in U.S. Pat. Nos. 4,069,055 and 4,069,056, the iodonium salts disclosed in EP 104,143, U.S. Pat. Nos. 339,049, 410,201, JP-A-2-150848 and JP-A-2-296514, the sulfonium salts disclosed in EP 370,693, EP 390,214, EP 233,567, EP 297,443, EP 297,442, U.S. Pat. Nos. 4,933,377, 161, 811, 410, 201, 339,049, 4,760,013, 4,734,444, 2,833, 827, German Patent Nos. 2,904,626, 3,604,580 and 3,604, 581, the selenonium salts described in J. V. Crivello et al., Macromolecules, 10 (6), 1307 (1977), and J. V. Crivello et al., J. Polymer Sci., Polymer Chem. Ed., 17, 1047 (1979), and the arsonium salts described in C. S. Wen et al., Teh. Proc. Conf. Rad. Curing ASIA, p. 478, Tokyo, October (1988) are exemplified.

As preferred compounds particularly from the aspects of reactivity and stability, the oxime ester compounds and the onium salts (diazonium salts, iodonium salts and sulfonium salts) are exemplified. These onium salts function as ionic radical polymerization initiators not acid generators in the present invention.

The onium salts preferably used in the invention are onium salts represented by the following formulae (RI-I) to (RI-III).

(RI-I)

(RI-II)

In formula (RI-I), $Ar_{11}$ represents an aryl group having 20 or less carbon atoms, which may have from 1 to 6 substituents, and as the preferred substituents, an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxyl group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms are exemplified. $Z_{11}^-$ represents a monovalent anion, specifically a halogen ion, a perchlorate ion, a hexafluorophosphate ion, a tetrafluoroborate ion, a sulfonate ion, a sulfinate ion, a thiosulfonate ion and a sulfate ion are exemplified. In view of stability, a perchlorate ion, a hexafluorophosphate ion, a tetrafluoro-borate ion, a sulfonate ion and a sulfinate ion are particularly preferred.

In formula (RI-II), $Ar_{21}$ and $Ar_{22}$ each independently represents an aryl group having 20 or less carbon atoms, which may have from 1 to 6 substituents, and as the preferred substituents, an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxyl group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms are exemplified. $Z_{21}^-$ represents a monovalent anion, specifically a halogen ion, a perchlorate ion, a hexafluoro-phosphate ion, a tetrafluoroborate ion, a sulfonate ion, a sulfinate ion, a thiosulfonate ion and a sulfate ion are exemplified. In view of stability and reactivity, a perchlorate ion, a hexafluorophosphate ion, a tetrafluoroborate ion, a sulfonate ion, a sulfinate ion and a carboxylate ion are particularly preferred.

In formula (RI-III), $R_{31}$, $R_{32}$ and $R_{33}$ each independently represents an aryl, alkyl, alkenyl or alkynyl group having 20 or less carbon atoms, which may have from 1 to 6 substituents. Above all, in view of stability and reactivity, an aryl group is preferred. As the substituents, an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxyl group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms are exemplified. $Z_{31}^-$ represents a monovalent anion, specifically a halogen ion, a perchlorate ion, a hexafluoro-phosphate ion, a tetrafluoroborate ion, a sulfonate ion, a sulfinate ion, a thiosulfonate ion, a sulfate ion and a carboxylate ion are exemplified. In view of stability and reactivity, a perchlorate ion, a hexafluorophosphate ion, a tetrafluoroborate ion, a sulfonate ion, a sulfinate ion and a carboxylate ion are particularly preferred. The carboxylate ion disclosed in JP-A-2001-343742 is more preferred, and the carboxylate ion disclosed in JP-A-2002-148790 is particularly preferred.

The specific examples of preferred onium salt compounds are shown below, but the present invention is not limited thereto.

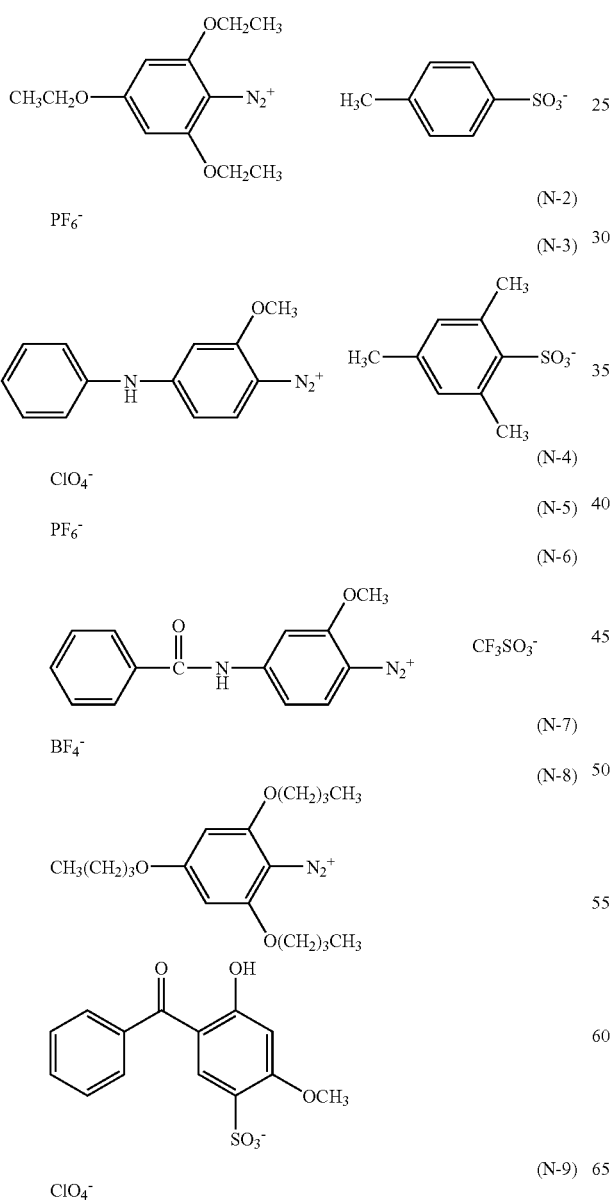
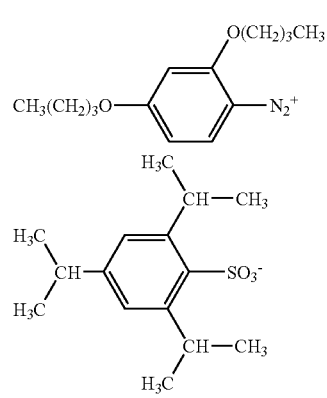
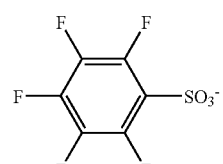
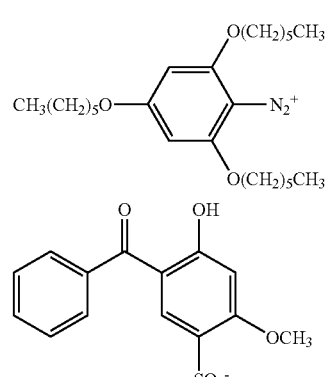
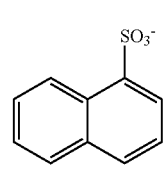
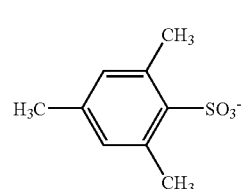
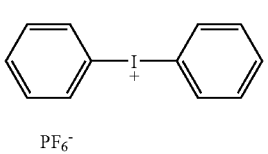

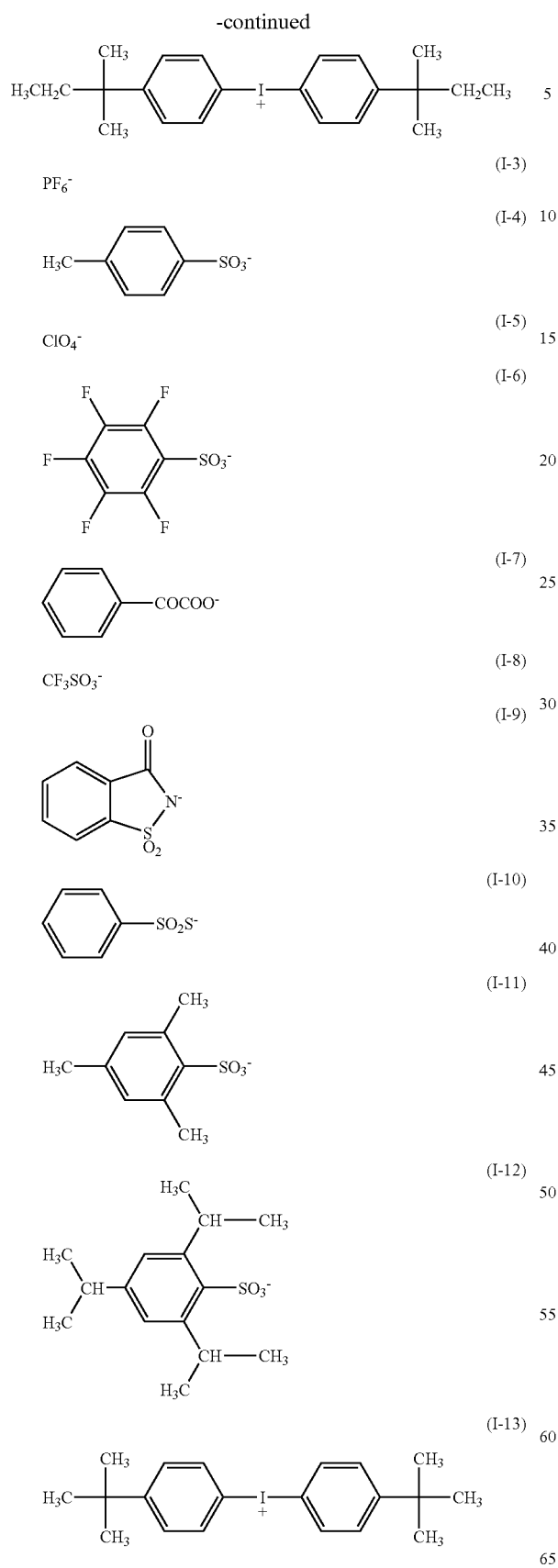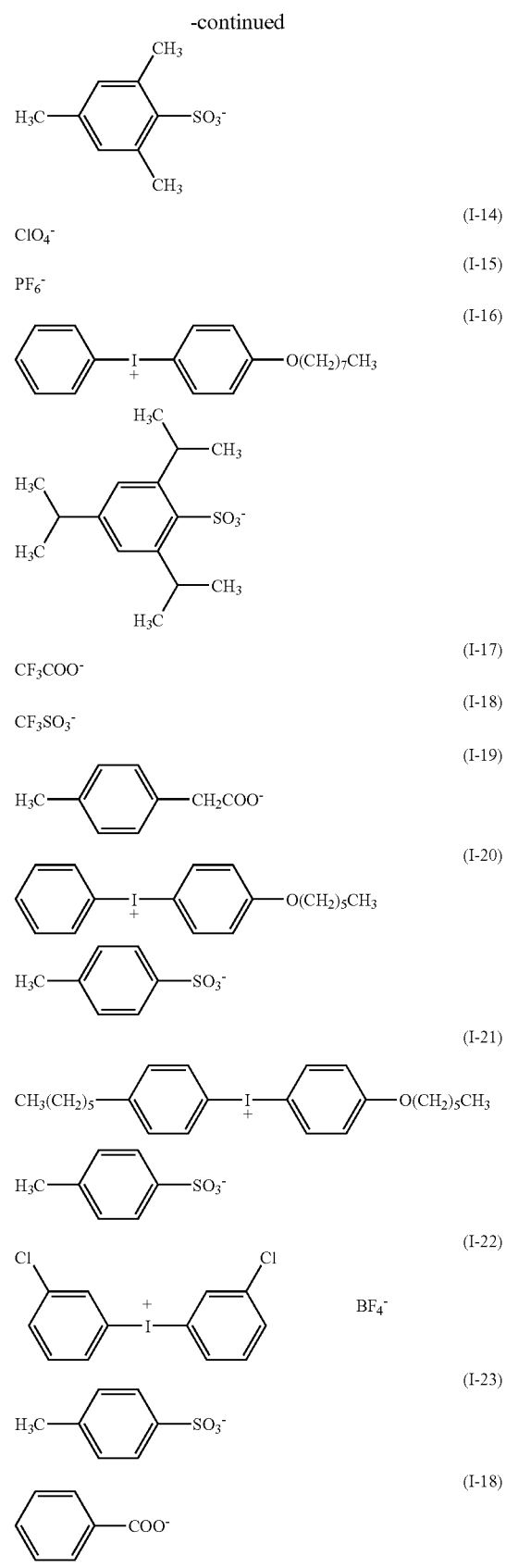

-continued
(S-1)
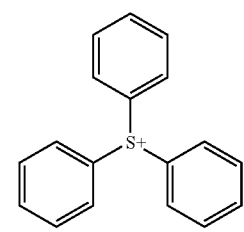
(S-2) PF$_6^-$
(S-3) ClO$_4^-$
(S-4)
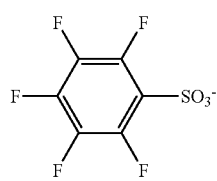
(S-5)
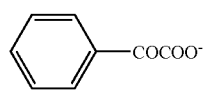
(S-6) CF$_3$SO$_3^-$
(S-7)
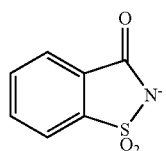
(S-8)
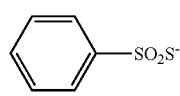
(S-9)
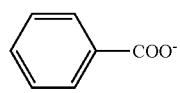
(S-10)
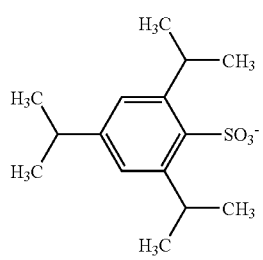
(S-11)
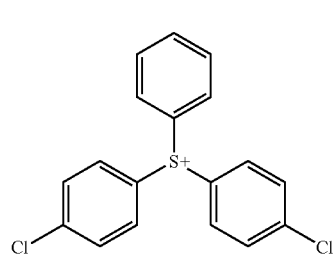
(S-12)
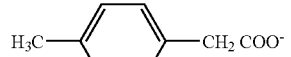
(S-13)
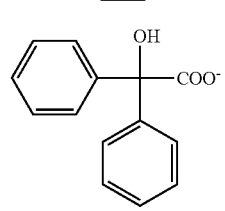
(S-14)
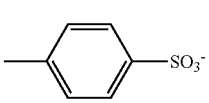
(S-15)
(S-16) BF$_4^-$
(S-17)
(S-18)
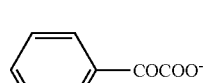
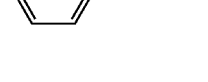
Polymerization initiators for use in the invention preferably have a maximum absorption wavelength of 400 nm or less, more preferably 360 nm or less, and most preferably 300 nm or less. By using polymerization initiators having the absorption wavelength in the ultraviolet region, the white light safety of the lithographic printing plate precursor is improved.

Polymerization initiators can be used in an amount of from 0.1 to 50% by weight to the total solids content constituting the image-recording layer, preferably from 0.5 to 30% by weight, and particularly preferably from 1 to 20% by weight. By using polymerization initiators in this range, good sensitivity and staining resistance of the non-image area in printing can be obtained. Polymerization initiators may be used alone, or two or more of them may be used in combination. Polymerization initiators may be added to the same layer with other components, or other layer may be provided for polymerization initiators.

(C) Polymerizable Compound:

The polymerizable compounds usable in an image-recording layer in the invention are addition polymerizable compounds having at least one ethylenic unsaturated double bond, and they are selected from the compounds having at least one, preferably two or more, ethylenic unsaturated bond at terminal. These compounds are well known in the field of this industry, and they can be used with no particular limitation in the invention. These polymerizable compounds have chemical forms of, e.g., a monomer, a prepolymer, i.e., a dimer, a trimer, an oligomer, and a mixture and a copolymer of them. As the examples of monomers and the copolymers thereof, unsaturated carboxylic acids (e.g., acrylic acid, methacrylic acid, itaconic acid, crotonic acid, isocrotonic acid, maleic acid, etc.), and esters and amides of these unsaturated carboxylic acids are exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of esters and amides of unsaturated carboxylic acids having a nucleophilic substituent such as a hydroxyl group, an amino group or a mercapto group with monofunctional or polyfunctional isocyanates or epoxies, and the dehydration condensation reaction products with monofunctional or polyfunctional carboxylic acids are also preferably used. Further, the addition reaction products of unsaturated carboxylic esters or amides having an electrophilic substituent such as an isocyanate group or an epoxy group with monofunctional or polyfunctional alcohols, amines or thiols, and the substitution reaction products of unsaturated carboxylic esters or amides having a separable substituent such as a halogen group or a tosyloxy group with monofunctional or polyfunctional alcohols, amines or thiols are also preferably used. As another example, it is also possible to use compounds in which the unsaturated carboxylic acids are replaced with unsaturated phosphonic acid, styrene, vinyl ether, etc.

The specific examples of monomers of the esters of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, isocyanuric acid ethylene oxide (EO)-modified triacrylate, polyester acrylate oligomer, isocyanuric acid EO-modified triacrylate, etc.

As methacrylates, the examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetra-methacrylate, dipentaerythritol dimethacrylate, dipenta-erythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxy-ethoxy)phenyl]dimethylmethane, etc.

As itaconates, the examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc. As crotonates, the examples include ethylene glycol dicrotonate, tetramethylene glycol dicrotonate, pentaerythritol dicrotonate, sorbitol tetradicrotonate, etc. As isocrotonates, the examples include ethylene glycol diisocrotonate, pentaerythritol diisocrotonate, sorbitol tetraisocrotonate, etc. As maleates, the examples include ethylene glycol dimaleate, triethylene glycol dimaleate, pentaerythritol dimaleate, sorbitol tetramaleate, etc.

As the examples of other esters, e.g., the aliphatic alcohol esters disclosed in JP-B-51-47334 and JP-A-57-196231, the esters having an aromatic skeleton disclosed in JP-A-59-5240, JP-A-59-5241 and JP-A-2-226149, and the esters containing an amino group disclosed in JP-A-1-165613 are also preferably used in the present invention. The above ester monomers can also be used as mixtures.

Further, the specific examples of the amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc. As other preferred amide monomers, those having a cyclohexylene structure disclosed in JP-B-54-21726 can be exemplified.

Further, urethane-based addition polymerizable compounds manufactured by the addition reaction of isocyanate and a hydroxyl group are also preferably used. As the specific examples of such compounds, as disclosed in JP-B-48-41708, a vinyl urethane compound containing two or more polymerizable vinyl groups in one molecule obtained by adding vinyl monomer having a hydroxyl group represented by the following formula (A) to a polyisocyanate compound having two or more isocyanate groups is exemplified.

$$CH_2=C(R_4)COOCH_2CH(R_5)OH \qquad (A)$$

wherein $R_4$ and $R_5$ each represents H or $CH_3$.

The urethane acrylates disclosed in JP-A-51-37193 and JP-B-2-32293, JP-B-2-16765, and the urethane compounds having an ethylene oxide skeleton disclosed in JP-B-58-49860, JP-B-56-17654, JP-B-62-39417 and JP-B-62-39418 are also preferably used in the invention. In addition, extremely high speed photopolymerizable compositions can be obtained by using addition polymerizable compounds having an amino structure and a sulfide structure in the molecule as disclosed in JP-A-63-2776531 JP-A-63-260909 and JP-A-1-105238.

As other examples, the polyfunctional acrylates and methacrylates, such as polyester acrylates, and epoxy acrylates obtained by reacting epoxy resins with (meth)acrylic acids as disclosed in JP-A-48-64183, JP-B-49-43191 and JP-B-52-30490 can be exemplified. The specific unsaturated compounds disclosed in JP-B-46-43946, JP-B-1-40337 and JP-B-1-40336, and the vinyl sulfonic acid compounds disclosed in JP-A-2-25493 can also be exemplified. Further, according to cases, the structures containing a perfluoroalkyl group disclosed in JP-A-61-22048 are preferably used. Moreover, the photo-curable monomers and oligomers introduced into Bulletin of Nippon Setchaku Kyokai, Vol. 20, No. 7, pp. 300-308 (1984) can also be used.

The details in usage of these polymerizable compound, e.g., what structure is to be used, whether the compound is to be used alone or in combination, or what an amount is to be used, can be optionally set up according to the final design of the performances of the lithographic printing plate precursor. For example, the conditions are selected from the viewpoint as follows.

In the point of sensitivity, the structure containing many unsaturated groups per molecule is preferred and bifunctional or higher functional groups are preferred in many cases. For increasing the strength of an image area, i.e., a hardened film, trifunctional or higher functional groups are preferred, and it is also effective to use different functional numbers and different polymerizable groups (e.g., acrylate, methacrylate, styrene compounds, vinyl ether compounds) in combination to control both sensitivity and strength.

Further, the selection and usage of the polymerizable compound are important factors for the compatibility with other components (e.g., a binder polymer, a polymerization initiator, a colorant) in the image-recording layer and dispersibility, for example, sometimes compatibility can be improved by using a low purity compound or two or more compounds in combination. Further, it is also possible to select a compound having a specific structure for the purpose of improving the adhesion property of a support and an overcoat layer described later.

Polymerizable compounds are used preferably in an amount of from 5 to 80% by weight in an image-recording layer, and more preferably from 25 to 75% by weight. They may be used alone, or two or more compounds may be used in combination. In addition, the structure, blending method and addition amount of polymerizable compounds can be properly selected in view of the degree of polymerization hindrance by oxygen, resolution, a fogging property, refractive index change and surface stickiness and, further, in some cases, layer constitution and coating method of undercoating and face coating may be taken.

Other Components of Image-recording Layer:

An image-recording layer in the present invention may contain components other than (A), (B) and (C), e.g., a binder polymer, a surfactant, a colorant, a printing out agent, a polymerization inhibitor (a thermal polymerization inhibitor), a higher fatty acid derivative, a plasticizer, inorganic fine particles and a low molecular weight hydrophilic compound.

A binder polymer can be used in the invention for improving film characteristics of an image-forming layer and on-press development. The binder polymer is not particularly restricted and any well-known compounds can be used, preferably linear organic polymers having a film-forming property. The examples of such binder polymers include acrylic resins, polyvinyl acetal resins, polyurethane resins, polyurea resins, polyimide resins, polyamide resins, epoxy resins, methacrylic resins, polystyrene resins, novolak type phenolic resins, polyester resin, synthetic rubber and natural rubber.

As more preferred binder polymers, (meth)acrylic resins, i.e., polymers of (meth)acrylic esters are exemplified. Especially, copolymers of alkyl (meth)acrylate with monomers having a —CH$_2$CH$_2$O— structure in the R moiety of —COOR in the (meth) acrylic esters are especially preferred. The specific examples are shown below, but the present invention is not limited thereto.

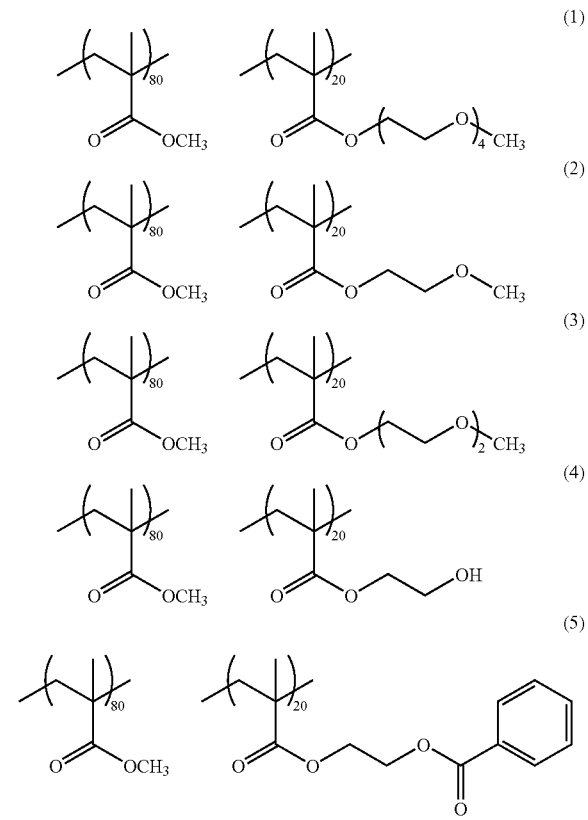

It is preferred for binder polymers to have a cross-linking property to improve the film strength of an image area. To give a cross-linkable property to binder polymers, it is effective to introduce a cross-linkable functional group such as an ethylenic unsaturated bond into the main chain or side chain of the binder polymers. A cross-linkable functional group may be introduced by copolymerization, or may be introduced by a polymer reaction.

As the examples of the polymers having an ethylenic unsaturated bond in the main chain of the molecule, poly-1,4-butadiene and poly-1,4-isoprene are exemplified.

As the examples of the polymers having an ethylenic unsaturated bond in the side chain of the molecule, polymers of esters or amides of acrylic or methacrylic esters, wherein at least a part of the residues of the esters or amides (R of —COOR or —CONHR) has an ethylenic unsaturated bond are exemplified.

As the examples of the residues having an ethylenic unsaturated bond (the above-described R), —(CH$_2$)$_n$CR$^1$=CR$^2$R$^3$,  —(CH$_2$O)$_n$CH$_2$CR$^1$=CR$^2$R$^3$, —(CH$_2$CH$_2$O)$_n$CH$_2$CR$^1$=CR$^2$R$^3$,  —(CH$_2$)$_n$NH—CO—O—CH$_2$CR$^1$=CR$^2$R$^3$, —(CH$_2$)$_n$—O—CO—CR$^1$=CR$^2$R$^3$ and (CH$_2$CH$_2$O)$_2$—X (wherein R$^1$, R$^2$ and R$^3$ each represents a hydrogen atom, a halogen atom, an alkyl group having from 1 to 20 carbon atoms, an aryl group, an alkoxyl group or an aryloxy group, and R$^1$ and R$^2$ or R$^3$ may be bonded to each other to form a ring, n represents an integer of from 1 to 10, and X represents a dicyclopentadienyl residue) are exemplified.

As the specific examples of ester residues, —CH$_2$CH=CH$_2$, —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$OCOC(CH$_3$)=CH$_2$, —CH$_2$CH$_2$OCOCH=CH$_2$, —CH$_2$CH$_2$—NH—COO—CH$_2$CH=CH$_2$ and CH$_2$CH$_2$O—X (wherein X represents a dicyclopentadienyl residue) are exemplified.

As the examples of amido residues, —CH$_2$CH=CH$_2$, —CH$_2$CH$_2$—Y (wherein Y represents a cyclohexene residue) and —CH$_2$CH$_2$—OCO—CH=CH$_2$ are exemplified.

When free radicals (polymerization initiation radicals or the grown radicals of a polymerizable compound in the polymerization process) are added to the cross-linkable functional groups of a binder polymer having a cross-linking property, addition polymerization occurs directly between the polymers or via the polymerization chains of the polymerizable compound, as a result, cross-linking is formed between the molecules of the polymers and the binder polymer is hardened. Alternatively, the atoms in the polymer (e.g., the hydrogen atoms on the carbon atoms contiguous to cross-linkable functional groups) are extracted by free radicals and polymer radicals are grown, the polymer radicals are bonded to each other, whereby cross-linking is formed between the polymer molecules, so that the binder polymer is hardened.

The amount of cross-linkable groups contained in a binder polymer (the amount contained of radical polymerizable unsaturated double bonds by the iodometric titration method) is preferably from 0.1 to 10.0 mmol per gram of the binder polymer, more preferably from 1.0 to 7.0 mmol, and most preferably from 2.0 to 5.5 mmol. Good sensitivity and good storage stability can be obtained with this range of cross-linkable groups.

From the viewpoint of the improvement of the on-press developability of the unexposed area of an image-recording layer, it is preferred that binder polymers have high solubility and dispersibility in ink and/or a fountain solution.

For improving the solubility and dispersibility in ink, binder polymers are preferably lipophilic, and for improving the solubility and dispersibility in a fountain solution, binder polymers are preferably hydrophilic. Accordingly, in the present invention, it is also effective to use a lipophilic binder polymer and a hydrophilic binder polymer in combination.

As hydrophilic binder polymers, binder polymers having a hydrophilic group, e.g., a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group are preferably exemplified.

The specific examples of hydrophilic binder polymers include gum arabic, casein, gelatin, starch derivatives, carboxymethyl cellulose and the sodium salt of it, cellulose acetate, sodium alginate, vinyl acetate-maleic acid copolymers, styrene-maleic acid copolymers, polyacrylic acids and the salts of them, polymethacrylic acids and the salts of them, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of 60 mol % or more, preferably 80 mol % or more, polyvinyl formal, polyvinyl butyral, polyvinyl pyrrolidone, homopolymers and copolymers of acrylamide, homopolymers and copolymers of methacrylamide, homopolymers and copolymers of N-methylol acrylamide, polyvinyl pyrrolidone, alcohol-soluble nylon, and polyether of 2,2-bis(4-hydroxyphenyl)propane and epichlorohydrin.

Binder polymers preferably have a weight average molecular weight of preferably 5,000 or higher, more preferably from 10,000 to 300,000, and a number average molecular weight of preferably 1,000 or higher, more preferably from 2,000 to 250,000. The polydisperse degree (weight average molecular weight/number average molecular weight) is preferably from 1.1 to 10.

The above binder polymers may be any of a random polymer, a block polymer and a graft polymer, but a random polymer is preferred.

These binder polymers can be manufactured by well-known methods. Binder polymers having a cross-linkable group on the side chain can be easily synthesized by radical polymerization or a polymer reaction.

Binder polymers may be used alone or as a mixture of two or more.

Binder polymers are used in an amount of preferably from 10 to 90% by weight to the total solids content of an image-forming layer, more preferably from 20 to 80% by weight. When binder polymers are used in this range, preferred strength of an image area and good image-forming property can be obtained.

It is preferred to use a polymerizable compound and a binder polymer in mass ratio of from 1/9 to 7/3.

In the present invention, it is preferred to use a surfactant in an image-recording layer to accelerate on-press development property at the initiating time of printing and to improve the conditions of coating surface. As the surfactants for these purposes, nonionic surfactants, anionic surfactants, cationic surfactants and amphoteric surfactants are used. Surfactants may be used alone or two or more surfactants may be used in combination.

The nonionic surfactants for use in the invention are not particularly restricted and conventionally well known surfactants can be used, e.g., polyoxyethylene alkyl ethers, polyoxyethylene alkyl phenyl ethers, polyoxyethylene polystyryl phenyl ethers, polyoxyethylene polyoxypropylene alkyl ethers, glycerol fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamine, triethanolamine fatty acid ester, trialkylamine oxide, polyethylene glycol, and copolymers of polyethylene glycol and polypropylene glycol are exemplified.

The anionic surfactants for use in the invention are not particularly restricted and conventionally well known surfactants can be used, e.g., fatty acid salts, abietates, hydroxyalkanesulfonates, alkanesulfonates, dialkylsulfo-succinates, straight chain alkylbenzenesulfonates, branched chain alkylbenzenesulfonates, alkylnaphthalenesulfonates, alkylphenoxypolyoxyethylenepropylsulfonates, polyoxyethylene alkyl sulfophenyl ethers, sodium N-methyl-N-oleyl-taurine, disodium N-alkylsulfosuccinic acid monoamide, petroleum sulfonates, sulfated beef tallow, sulfates of fatty acid alkyl ester, alkylsulfuric esters, polyoxyethylene alkyl ether sulfuric esters, fatty acid monoglyceride sulfuric esters, polyoxyethylene alkyl phenyl ether sulfuric esters, polyoxyethylene styryl phenyl ether sulfuric esters, alkylphosphoric esters, polyoxyethylene alkyl ether phosphoric esters, polyoxyethylene alkyl phenyl ether phosphoric esters, partial saponification products of styrene/maleic anhydride copolymer, partial saponification products of olefin/maleic anhydride copolymer, and naphthalene sulfonate formaldehyde condensation products are exemplified.

The cationic surfactants for use in the invention are not particularly restricted and conventionally well known surfactants can be used, e.g., alkylamine salts, quaternary ammonium salts, polyoxyethyene alkylamine salts, and polyethylene polyamine derivatives are exemplified.

The amphoteric surfactants for use in the invention are not particularly restricted and conventionally well known surfactants can be used, e.g., carboxybetaines, amino-carboxylic acids, sulfobetaines, aminosulfuric esters and imidazolines are exemplified.

In the above surfactants, "polyoxyethylene" can be taken as "polyoxyalkylene" such as polyoxymethylene, polyoxypropylene, or polyoxybutylene, and these surfactants can also be used in the invention.

As more preferred surfactants, fluorine surfactants containing a perfluoroalkyl group in the molecule are exemplified. As such surfactants, anionic surfactants, e.g., perfluoroalkylcarboxylate, and perfluoroalkylsulfonate, perfluoroalkylphosphate; amphoteric surfactants, e.g., perfluoroalkylbetaine; cationic surfactants, e.g., perfluoroalkyltrimethylammonium salt; and nonionic surfactants, e.g., perfluoroalkylamine oxide, perfluoroalkyl ethylene oxide addition product, oligomers containing a perfluoroalkyl group and a hydrophilic group, oligomers containing a perfluoroalkyl group and a lipophilic group, oligomers containing a perfluoroalkyl group, a hydrophilic group, and a lipophilic group, and urethane containing a perfluoroalkyl group and a lipophilic group are exemplified. Further, the fluorine surfactants disclosed in JP-A-62-170950, JP-A-62-226143 and JP-A-60-168144 are also preferably used.

Surfactants can be used alone, or two or more surfactants can be used in combination.

Surfactants are preferably used in an image-recording layer in an amount of from 0.001 to 10% by weight, more preferably from 0.01 to 5% by weight.

Dyes having large absorption in the visible ray region can be used as the colorants of images in an image-recording layer in the invention. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Chemical Industry Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the dyes disclosed in JP-A-62-293247 can be exemplified. In addition, pigments such as phthalocyanine pigments, azo pigments, carbon black and titanium oxide are also preferably used.

These colorants are preferably added to discriminate an image area from a non-image area after image formation. The addition amount of colorants is preferably from 0.01 to 10% by weight in an image-forming layer.

Compounds that discolor by acid or radical can be added to an image-recording layer in the invention for forming a print out images. As such compounds, various dyes, e.g., diphenylmethane, triphenylmethane, thiazine, oxazine, xanthene, anthraquinone, iminoquinone, azo and azomethine dyes are effectively used.

The specific-examples of such dyes include Brilliant Green, Ethyl Violet, Methyl Green, Crystal Violet, Basic Fuchsine, Methyl Violet 2B, Quinaldine Red, Rose Bengal, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (manufactured by HODOGAYA CHEMICAL Co., Ltd.), Oil Blue #603 (manufactured by Orient Chemical Industry Co., Ltd.), Oil Pink #312 (manufactured by Orient Chemical Industry Co., Ltd.), Oil Red 5B (manufactured by Orient Chemical Industry Co., Ltd.), Oil Scarlet #308 (manufactured by Orient Chemical Industry Co., Ltd.), Oil Red OG (manufactured by Orient Chemical Industry Co., Ltd.), Oil Red RR (manufactured by Orient Chemical Industry Co., Ltd.), Oil Green #502 (manufactured by Orient Chemical Industry Co., Ltd.), Spiron Red BEH Special (manufactured by HODOGAYA CHEMICAL Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)amino-phenyliminonaphthoquinone, 1-phenyl-3-methyl-4-p-diethyl-aminophenylimino-5-pyrazolone, and 1-β-naphthyl-4-p-diethylaminophenylimino-5-pyrazolone, and leuco dyes such as p,p',p"-hexamethyltriaminotriphenylmethane (Leuco Crystal Violet), Pergascript Blue SRB (manufactured by Ciga Geigy A.G.).

In addition to the above, leuco dyes known as the materials of heat-sensitive paper and pressure-sensitive paper are also preferred. The specific examples of the leuco dyes include Crystal Violet Lactone, Malachite Green Lactone, Benzoyl Leuco Methylene Blue, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethyl-amino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethyl-amino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methyl-indol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl)-phthalide.

The dyes that discolor by acid or radical are preferably added to an image-recording layer in an amount of from 0.01 to 10% by weight.

For preventing unnecessary thermal polymerization of polymerizable compound (C) during manufacture or preservation of an image-recording layer, it is preferred that a small amount of thermal polymerization inhibitor be added to an image-recording layer in the invention.

As the thermal polymerization inhibitors, e.g., hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt are exemplified.

The amount of the thermal polymerization inhibitor to be added to an image-recording layer is preferably from about 0.01 to about 5% by weight.

For preventing the polymerization hindrance due to oxygen, higher fatty acid derivatives, e.g., behenic acid and behenic acid amide, may be added to an image-recording layer in the invention and locally exist on the surface of the image-recording layer in the drying process after coating. The addition amount of the higher fatty acid derivatives is preferably from about 0.1 to about 10% by weight to the total solids content of the image-recording layer.

An image-recording layer in the present invention may contain a plasticizer to improve on-press developability. The examples of plasticizers include phthalates, e.g., dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, and diallyl phthalate; glycol esters, e.g., dimethyl glycol phthalate, ethyl phthalyl ethyl glycolate, methyl phthalyl ethyl glycolate, butyl phthalyl butyl glycolate, and triethylene glycol dicaprylate; phosphates, e.g., tricresyl phosphate and triphenyl phosphate; aliphatic dibasic esters, e.g., diisobutyl adipate, dioctyl adipate, dimethyl sebacate, dibutyl sebacate, dioctyl azelate, and dibutyl maleate; and polyglycidyl methacrylate, triethyl citrate, glycerol triacetyl ester and butyl laurate.

The ration of plasticizers added to an image-recording layer is preferably about 30% by weight or less.

An image-recording layer in the invention may contain inorganic fine particles for the purposes of strengthening interface adhesion property by surface roughening treatment, increasing the strength of the hardened film of an image-recording layer, and improving on-press developability.

As the inorganic fine particles, e.g., silica, alumina, magnesium oxide, titanium oxide, magnesium carbonate, calcium alginate and mixtures of these fine particles are preferably used.

The average particle size of inorganic fine particles is preferably from 5 nm to 10 µm, more preferably from 0.5 to 3 µm. With this range of the average particle size, inorganic fine particles are stably dispersed in the image-recording layer and the film strength of the image-recording layer can be sufficiently retained, thus a non-image area difficult to be stained and excellent in hydrophilicity can be formed.

These inorganic fine particles are easily available as commercial products of colloidal silica dispersion and the like.

The addition amount of inorganic fine particles is preferably 20% by weight or less to the solids content of the image-recording layer, more preferably 10% by weight or less.

For the improvement of on-press developability, an image-recording layer in the invention may contain hydrophilic low molecular weight compounds. As the hydrophilic low molecular weight compounds, water-soluble organic compounds, such as glycols, e.g., ethylene glycol, diethylene glycol, triethylene glycol, propylene glycol, dipropylene glycol, tripropylene glycol, and ether or ester derivatives of these glycols, polyhydroxies, e.g., glycerol and pentaerythritol, organic amines, e.g., triethanolamine, and diethanolamine, and salts thereof, organic sulfonic acids, e.g., toluenesulfonic acid and benzenesulfonic acid, and salts thereof, organic phosphonic acids, e.g., phenylphosphonic acid, and salts thereof, and organic carboxylic acids, e.g., tartaric acid, oxalic acid, citric acid, malic acid, lactic acid, gluconic acid and amino acid, and salts thereof, and organic quaternary ammonium salts, e.g., tetraethylamine hydrochloride are exemplified.

Formation of Image-Recording Layer:

In the present invention, for containing the above-described constitutional components in an image-recording layer, these components can be contained in the state of being microencapsulated, according to necessity. A part of the components to be contained can be microencapsulated, and the remaining can be contained in an image-recording layer out of microcapsules in an arbitrary ratio. It is preferred for an image-recording layer in the present invention to contain microcapsules encapsulating at least one of the above actinic ray absorber, polymerization initiator and polymerizable compound. On-press developability of an image-recording layer can be improved by containing microcapsules.

The constitutional components of image-recording layer can be microencapsulated by well-known methods. For example, as the manufacturing method of microcapsules, the method making use of coacervation as disclosed in U.S. Pat. Nos. 2,800,457 and 2,800,458, the interfacial polymerization method as disclosed in U.S. Pat. No. 3,287,154, JP-B-38-19574 and JP-B-42-446, the method by the precipitation of a polymer as disclosed in U.S. Pat. Nos. 3,418,250 and 3,660,304, the method of using isocyanate polyol wall materials as disclosed in U.S. Pat. No. 3,796,669, the method of using isocyanate wall materials as disclosed in U.S. Pat. No. 3,914,511, the method of using urea-formaldehyde series or urea-formaldehyde-resorcinol series wall materials as disclosed in U.S. Pat. Nos. 4,001,140, 4,087,376 and 4,089,802, the method of using melamine-formaldehyde resins and hydroxy cellulose wall materials as disclosed in U.S. Pat. No. 4,025,445, the monomer polymerization in situ method as disclosed in JP-B-36-9163 and JP-B-51-9079, the spray drying method as disclosed in British Patent 930,422 and U.S. Pat. No. 3,111,407, and the electrolytic dispersion cooling method as disclosed in British Patents 952,807 and 967,074 can be exemplified, but the present invention is not limited to these methods.

The microcapsule walls preferably used in the invention have three dimensional cross-linking and a property of swelling by a solvent. From this point of view, polyurea, polyurethane, polyester, polycarbonate, polyamide, and the mixtures of these compounds are preferably used as the microcapsule wall materials, and polyurea and polyurethane are particularly preferred. Compounds having cross-linkable functional groups such as ethylenic unsaturated bonds that can be used in the above binder polymers may be introduced.

The average particle size of the microcapsules is preferably from 0.01 to 3.0 µm, more preferably from 0.05 to 2.0 µm, and particularly preferably from 0.10 to 1.0 µm. Good resolution and aging stability can be obtained with this range of particle size.

An image-recording layer in the invention is formed by coating a coating solution prepared by dispersing or dissolving necessary constitutional components according to any of the above modes. As the solvents used here, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethyl-acetamide, N,N-dimethylformamide, tetramethylurea, N-methyl-pyrrolidone, dimethyl sulfoxide, sulforan, γ-butyrolactone, toluene, and water are exemplified, but solvents are not limited thereto. These solvents are used alone or as mixture. The concentration of the solid contents of the coating solution is preferably from 1 to 50% by weight.

It is also possible to form an image-recording layer in the invention by preparing a plurality of coating solutions by dispersing or dissolving the same or different components in the same or different solvents, and repeating the coating and drying a plurality of times.

The coating amount of an image-forming layer (solids content) is generally preferably from 0.3 to 1.5 g/m$^2$, and more preferably from 0.5 to 1.5 g/m$^2$.

Various coating methods can be used, e.g., bar coating, rotary coating, spray coating, curtain coating, dip coating, air knife coating, blade coating, and roll coating can be used.

Support:

Supports for use in the lithographic printing plate precursor of the invention are not particularly limited and any materials can be used so long as they are dimensionally stable and sheet-like materials. For example, paper, paper laminated with plastics (e.g., polyethylene, polypropylene, polystyrene, etc.), metal sheets (e.g., aluminum, zinc, copper, etc.), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper and plastic films laminated or deposited with the above metals can be exemplified as the materials of the support. Preferred supports are a polyester film and an aluminum sheet. Above all, aluminum sheets, which are dimensionally stable and comparatively inexpensive, are preferred.

Aluminum sheets are a pure aluminum sheet, alloy sheets containing aluminum as a main component and a trace amount of different elements, and aluminum or aluminum alloy thin films laminated with plastics. The examples of different elements contained in aluminum alloys include silicon, iron, manganese, copper, magnesium, chromium, zinc, bismuth, nickel, titanium, etc. The different element content in aluminum alloys is 10% by weight or less. In the present invention, a pure aluminum sheet is preferred but 100% pure aluminum is difficult to produce from the refining technique, accordingly, an extremely small amount of different elements may be contained. Thus, the compositions of aluminum sheets used in the invention are not specified, and aluminum sheets of conventionally well-known and commonly used materials can be optionally used.

A support for use in the invention has a thickness of preferably from 0.1 to 0.6 mm, more preferably from 0.15 to 0.4 mm, and most preferably from 0.2 to 0.3 mm.

Prior to use an aluminum sheet, it is preferred to perform surface treatment, e.g., surface roughening treatment and anodizing treatment. By performing surface treatment, the improvement of hydrophilicity and the security of the adhesion of an image-recording layer and a support become easy.

Prior to surface roughening treatment of an aluminum sheet, if necessary, degreasing treatment with a surfactant, an organic solvent or an alkaline aqueous solution is carried out to remove the rolling oil on the surface of an aluminum sheet.

Surface roughening treatment of the surface of an aluminum sheet is performed by various methods, e.g., mechanical surface roughening treatment, electrochemical surface roughening treatment (surface roughening treatment of electrochemically dissolving the surface), and chemical surface roughening treatment (surface roughening treatment of chemically selectively dissolving the surface) are exemplified.

As the method of mechanical surface roughening treatment, well-known methods, e.g., a ball rubbing method, a brush abrading method, a blast abrading method, or a buffing method, can be used.

As the method of electrochemical surface roughening treatment, a method of roughening in an electrolyte containing an acid such as a hydrochloric acid or a nitric acid by alternating current or direct current can be used. Further, a method of using mixed acids can be used as disclosed in JP-A-54-63902.

The aluminum sheet subjected to surface roughening treatment is, if necessary, subjected to alkali etching treatment with an aqueous solution of potassium hydroxide or sodium hydroxide and neutralizing treatment and then to anodizing treatment to increase the abrasion resistance of the surface.

Various electrolytes for forming porous oxide film can be used in the anodizing treatment of an aluminum sheet, and sulfuric acid, hydrochloric acid, oxalic acid, chromic acid and mixed acids of these acids are generally used. The concentrations of these electrolytes are arbitrarily determined according to the kinds of electrolytes.

Anodizing treatment conditions vary according to electrolytes used and cannot be specified unconditionally, but in general the appropriate concentration of electrolyte is from 1 to 80% by weight solution, the liquid temperature is from 5 to 70° C., the electric current density is from 5 to 60 A/dm$^2$, the voltage is from 1 to 100 V, electrolytic time is from 10 seconds to 5 minutes. The amount of the anodic oxide film formed is preferably from 1.0 to 5.0 g/m$^2$, more preferably from 1.5 to 4.0 g/m$^2$. With this range of the amount of the anodic oxide film, good press life and the scratch resistance of the non-image area of a lithographic printing plate can be obtained.

After anodizing treatment, if necessary, the surface of the aluminum sheet is subjected to hydrophilic treatment. As the hydrophilic treatment, a method of treating the aluminum sheet with an alkali metal silicate as disclosed in U.S. Pat. Nos. 2,714,066, 3,181,461, 3,280,734 and 3,902,734 are known. These are methods of immersing the support in an aqueous solution of sodium silicate, or electrolytically treating. Besides these methods, a method of treating the support with a potassium fluorozirconate as disclosed in JP-B-36-22063, and a method of treating the support with a polyvinyl phosphonic acid as disclosed in U.S. Pat. Nos. 3,276,868, 4,153,461 and 4,689,272 are exemplified.

A support preferably has central line average surface roughness of from 0.10 to 1.2 μm. With this range of surface roughness, good adhesion of a support with an image-recording layer, good press life and good staining resistance can be obtained.

As the color density of a support, from 0.15 to 0.65 in a reflection density value is preferred. With this range of color density, good image forming property due to prevention of halation at image exposure and good detecting property of the printing plate after development can be obtained.

Backcoat:

After surface treatment of a support or after forming an undercoat layer, if necessary, a backcoat can be provided on the back surface of the support.

As the backcoat, e.g., coating layers comprising organic polymer compounds as disclosed in JP-A-5-45885, and coating layers comprising metallic oxides obtained by hydrolysis and polycondensation of organic or inorganic metallic compounds as disclosed in JP-A-6-35174 are preferably used. To use alkoxy compounds of silicon, e.g., $Si(OCH_3)_4$, $Si(OC_2H_5)_4$, $Si(OC_3H_7)_4$, $Si(OC_4H_9)_4$, is preferred for the in expensiveness and easy availability of the materials.

Undercoat Layer:

It is preferred for a lithographic printing plate precursor in the invention to have an undercoat layer on a support containing a compound having a polymerizable group. By providing such undercoat layer, the adhesion of the support with an image-recording layer can be heightened. As the polymerizable compound, addition polymerization reactive groups, e.g., an alkenyl group and an alkynyl group are exemplified. The examples of the alkenyl groups include a vinyl group, a propenyl group, an allyl group, a butenyl group and a dialkylmaleimido group, and the examples of the alkynyl groups include an acetylene group and an alkylacetylene group, but the present invention is not restricted to these groups. Of these, a vinyl group, a propenyl group, an allyl group, an acrylic group which is a derivative of a vinyl group, and a methacrylic group which is a derivative of a propenyl group are preferred. As the specific examples of the compound having a polymerizable group, the silane coupling agent having an addition polymerizable ethylenic double bond reactive group disclosed in JP-A-10-282679, and the phosphorus compounds having an ethylenic double bond reactive group disclosed in JP-A-2-304441 are preferred.

It is particularly preferred for the compounds having a polymerizable group to further have a support-adsorptive group and a hydrophilicity-imparting group in the molecule from the viewpoint of further improvements of adhesion, on-press developability and staining resistance. A support-adsorptive group used here means, e.g., a group that causes, in general, ion bonding, hydrogen bonding, coordinate bonding, or bonding by intermolecular force with the metals, metallic oxides and hydroxyl groups present on a support subjected to anodizing treatment or hydrophilization treatment. As the support-adsorptive groups, an acid radical and an onium group are preferred. As the acid radicals, those having an acid dissociation constant (pKa) of 7 or less are preferred, specifically, —COOH, —$SO_3H$, —$OSO_3H$, —$PO_3H_2$, —$OPO_3H_2$, —$CONHSO_2$—, —$SO_2NHSO_2$— are exemplified. —$PO_3H_2$ is particularly preferred of these. As the onium groups, onium groups deriving from the atoms belonging to VB group (15 group) or VIB group (16 group) of the Periodic Table, preferably onium groups derived from a nitrogen atom, a phosphorus atom or a sulfur atom, particularly preferably onium groups derived from a nitrogen atom are exemplified. As the hydrophilicity-imparting groups, an ethylene oxide group (—$OCH_2CH_2$—), and a sulfonic acid group are exemplified.

The coating amount of an undercoat layer (solids content) is preferably from 0.1 to 100 mg/m², more preferably from 1 to 30 mg/m².

Plate-making and Printing:

In the lithographic printing method in the invention, the above lithographic printing plate precursor of the invention is imagewise exposed by exposure through a transparent original having a line image and a dot image, or by laser scanning exposure by digital data. As exposure light sources, e.g., a carbon arc lamp, a high-pressure mercury lamp, a xenon lamp, a metal halide lamp, a fluorescent lamp, a tungsten lamp, a halogen lamp, an ultraviolet laser, a visible laser and an infrared laser are exemplified. Lasers are particularly preferred, and a solid state laser and a semiconductor laser radiating infrared rays of from 760 to 1,200 nm, and a semiconductor laser radiating rays of from 250 to 420 nm are exemplified. When a laser is used, it is preferred to perform imagewise scanning exposure according to digital data. For expediting exposure time, it is preferred to use a multi-beam laser device.

When an infrared ray leaser is used, the exposure time per a pixel is preferably not longer than 20 μsec. The quantity of irradiation energy is preferably from 10 to 300 mJ/cm².

When an ultraviolet laser is used, the staying time on pixcels is preferably as short as possible for suppressing the competitive reaction with oxygen, preferably 1 msec or less, more preferably 500 μsec or less, and most preferably 100 μsec or less. The quantity of irradiation energy is preferably from 0.1 to 10 mJ/cm².

In the lithographic printing method in the invention, as described above, after the lithographic printing plate precursor of the invention is imagewise exposed with laser beams, printing can be carried out by supplying oily ink and aqueous component without being subjected to development process.

Specifically, a method of subjecting a lithographic printing plate precursor to laser exposure, and then mounting the exposed printing plate precursor on a printing press without undergoing development process and perform printing, and a method of mounting a lithographic printing plate precursor on a printing press, and then exposing the printing plate precursor with laser beams on the printing press, and perform printing without subjecting to development process are exemplified.

When a lithographic printing plate precursor is imagewise exposed with laser beams and printing is performed by supplying oily ink and aqueous component without being subjected to development process such as wet development process, the image-recording layer hardened by exposure forms an oily ink-accepting area having a lipophilic surface at the exposed area of the image-recording layer. On the other hand, at the unexposed area, unhardened image-recording layer is dissolved or dispersed with the supplied oily ink and aqueous component and removed, whereby a hydrophilic surface is bared at that area.

As a result, the aqueous component adheres to the bared hydrophilic surface, the oily ink adheres to the image-recording layer in the exposed area, and printing is initiated. Here, the one supplied first to the printing plate may be oily ink or may be an aqueous component, but for preventing the aqueous component from becoming dirty by the image-recording layer at the unexposed area, it is preferred to supply oily ink in the first place. As the aqueous component and the oily ink, fountain solutions and oily inks used in ordinary lithographic printing are used.

Thus, a lithographic printing plate precursor is subjected to on-press development on an offset printer and used in printing of a plenty of sheets.

EXAMPLE

The present invention will be described with reference to examples but the present invention is not limited thereto.

Example 1

(1) Manufacture of Support:

For removing the rolling oil of the surface, an aluminum sheet having a thickness of 0.3 mm (material 1050) was subjected to degreasing treatment with a 10% by weight sodium alminate aqueous solution at 50° C. for 30 seconds, and then the aluminum surface was subjected to brush-graining with three nylon brushes planted with hairs having a hair diameter of 0.3 mm and a suspension of pumice stone and water of a median diameter of 25 μm (the specific gravity: 1.1 g/cm³), and the surface of the sheet was thoroughly washed with water. The sheet was immersed in a 25% by weight sodium hydroxide aqueous solution at 45° C. for 9 seconds for etching, and washed with water. After water washing, the sheet was further immersed in a 20% by weight nitric acid aqueous solution followed by washing with water. The etched amount of the surface by graining was about 3 g/m².

Electrochemical surface roughening treatment was performed continuously by alternating voltage of 60 Hz. The electrolyte at this time was an aqueous solution containing 1% by weight of a nitric acid (containing a 0.5% by weight of an aluminum ion) and the liquid temperature was 50° C. As the alternating current electric source waveform, trapezoidal rectangular waveform alternating current was used, the time TP required for the electric current value to reach the peak from 0 was 0.8 msec, the duty ratio was 1/1, and electrochemical surface roughening treatment was performed with a carbon electrode as the counter electrode. Ferrite was used as the auxiliary anode. The electric current density was 30 A/dm² at a peak value of electric current, and 5% of the electric current from the electric source was diverted to the auxiliary anode. The quantity of electricity was 175 C/dm² in the quantity of electricity in the case where the aluminum sheet was the anode. The aluminum sheet was then washed with water.

Subsequently, electrochemical surface roughening treatment of the aluminum sheet was performed with an electrolyte containing a 0.5% by weight hydrochloric acid aqueous solution (containing 0.5% by weight of aluminum ion) at a liquid temperature of 50° C. on the condition of the quantity of electricity of 50 C/dm² in the case where the aluminum sheet was the anode in the same manner as in the above nitric acid electrolysis. The sheet was then subjected to spray washing. The sheet was provided with 2.5 g/m² of an anodic oxide film with an electrolyte containing a 15% by weight sulfuric acid (containing 0.5% by weight of aluminum ion) with the electric current density of 15 A/dm² at, washed, dried, and further subjected to treatment with a 2.5% by weight sodium silicate aqueous solution at 30° C. for 10 seconds. The central line surface roughness (Ra) of the sheet measured with a needle having a diameter of 2 μm was 0.51 μm.

(2) Formation of Image-recording Layer:

The image-recording layer coating solution having the composition shown below was coated on the above support with bar coating, dried at 70° C. for 60 seconds in an oven, whereby an image-recording layer having a dry coating amount of 0.8 g/m² was formed. The overcoat layer coating solution (1) shown below was coated on the above-formed image-recording layer in a layer thickness of 0.5 g/m² with wire bar coating, and dried at 70° C. for 60 seconds in the same manner, whereby lithographic printing plate precursor 1 was obtained.

| Image-recording layer coating solution (1): | |
|---|---|
| Water | 100 g |
| The following microcapsule (1) (in terms of solid content) | 5 g |
| The following polymerization initiator (1) | 0.5 g |
| The following fluorine surfactant (1) | 0.2 g |

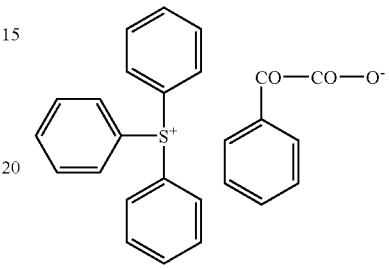

Polymerization Initiator (1)

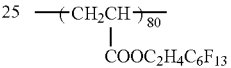

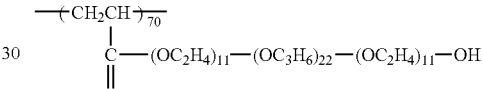

Fluorine Surfactant (1)

Synthesis of Microcapsule (1):

As the oil phase component, 10 g of the addition product of trimethylolpropane and xylylene diisocyanate (Takenate D-110N, manufactured by Mitsui Takeda Chemicals Inc.), 3.15 g of pentaerythritol triacrylate (SR444, manufactured by Nippon Kayaku Co., Ltd.), 0.35 g of the following infrared absorber (1), 1 g of 3-(N,N-diethylamino)-6-methyl-7-anilinofluoran (ODB, manufactured by YAMAMOTO CHEMICALS INC.), and 0.1 g of Pionin A-41C (manufactured by Takemoto Oil & Fat) were dissolved in 17 g of ethyl acetate. As the aqueous phase component, 40 g of a 4% by weight aqueous solution of PVA-205 was prepared. The oil phase component and the aqueous phase component were mixed, and emulsified with a homogenizer at 12,000 rpm for 10 minutes. The obtained emulsified product was added to 25 g of distilled water, stirred at room temperature for 30 minutes, and then stirred at 40° C. for 3 hours. The concentration of the solids content of the obtained microcapsule solution (1) was diluted to reach 20% by weight with distilled water. The average particle size was 0.3 μm.

Infrared Absorber (1)

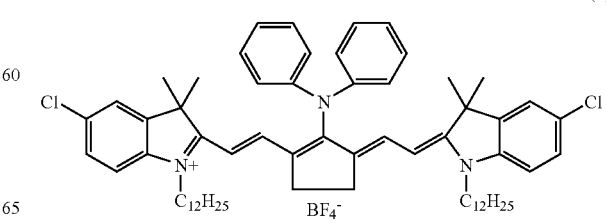

| Overcoat layer coating solution (1): | |
|---|---|
| The following mica dispersion (1) | 8.0 g |
| Polyvinyl alcohol (saponification degree: 98.5 mol %) (PVA-110, manufactured by Kuraray Co., Ltd.) | 1.3 g |
| Sodium 2-ethylhexylsulfosuccinate | 0.3 g |
| Water | 133 g |

Preparation of Mica Dispersion (1):

Synthetic mica (32 g) (Somasif ME-100, aspect ratio: 1,000 or more, manufactured by CO-OP CHEMICAL CO., LTD.) was added to 368 g of water, and dispersed with a homogenizer until the average particle became 0.5 μm (laser scattering method), whereby mica dispersion (1) was obtained.

Example 2

The image-recording layer coating solution (2) having the composition shown below was coated on the support obtained in Example 1 with bar coating, dried at 100° C. for 60 seconds in an oven, whereby an image-recording layer having a dry coating amount of 1.0 g/m² was formed. The overcoat layer coating solution (1) in Example 1 was coated on the above-formed image-recording layer in a layer thickness of 0.5 g/m² with wire bar coating, and dried at 70° C. for 60 seconds in the same manner, whereby lithographic printing plate precursor 2 was obtained.

| Image-forming layer coating solution (2): | |
|---|---|
| The following infrared absorber (2) | 0.05 g |
| The above polymerization initiator (1) | 0.2 g |
| The following binder polymer (1) (average molecular weight: 80,000) | 0.5 g |
| Polymerizable compound Isocyanuric acid EO-modified triacrylate (NK ester M-315, manufactured by SHIN-NAKAMURA CHEMICAL CO., LTD.) | 1.0 g |
| Naphthalene sulfonate of Victoria Pure Blue | 0.02 g |
| The above fluorine surfactant (1) | 0.1 g |
| Methyl ethyl ketone | 18.0 g |

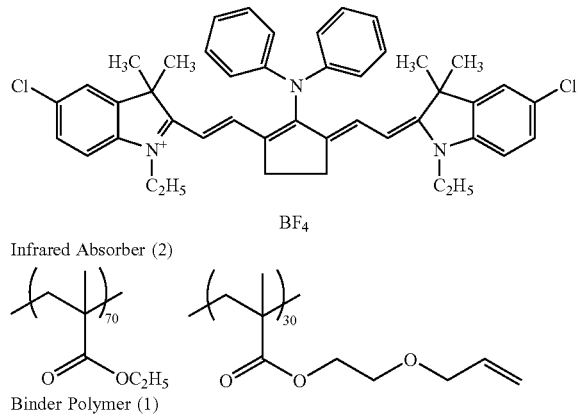

Infrared Absorber (2)

Binder Polymer (1)

Example 3

Lithographic printing plate precursor 3 was obtained in the same manner as in Example 1 except for changing the mica dispersion to the following mica dispersion (2).

Preparation of Mica Dispersion (2):

Synthetic mica (12 g) (Suzulight 40H, manufactured by MRI INTERNATIONAL INC.) was added to 188 g of water containing 2 g of sodium dodecylsulfate, and dispersed with a homogenizer at 10,000 rpm for 30 minutes, and 200 g of a 5.6% by weight gelatin aqueous solution was further added thereto, whereby mica dispersion (2) was obtained.

Example 4

Lithographic printing plate precursor 4 was obtained in the same manner as in Example 1 except for changing the mica dispersion to the following mica dispersion (3).

Preparation of Mica Dispersion (3):

Synthetic mica (13 parts) (Somasif MEB-3, manufactured by CO-OP CHEMICAL CO., LTD.), 100 parts of aluminum hydroxide dispersion (HIGILITE H42S, manufactured by Showa Keikinzoku Co., Ltd.), 1 part of sodium hexametaphosphate, and 150 parts of water were mixed, and dispersed with a wet disperser such as a ball mill until the average particle became 0.7 μm, whereby mica dispersion (3) was obtained.

Comparative Example 1

Lithographic printing plate precursor 5 was obtained in the same manner as in Example 1 except that an overcoat layer was not provided.

Comparative Example 2

Lithographic printing plate precursor 6 was obtained in the same manner as in Example 1 except that 8.0 g of mica dispersion was not added to overcoat layer coating solution (1).

2. Exposure and Printing

Each of the obtained lithographic printing plate precursors 1 to 6 was subjected to exposure with Trendsetter 3244VX (manufactured by Creo Products Incorporated) loading a water-cooling type 40 W infrared semiconductor laser on the conditions of output of 9 W, external drum rotating speed of 210 rpm, and resolution of 2,400 dpi, so that the exposure image contained a fine line chart. The exposed printing precursor was mounted on SOR-M cylinder (manufactured by Heidelberg Japan K.K.) without performing development. A fountain solution (EU-3 (an etching solution manufactured by Fuji Photo Film Co., Ltd.)/water/isopropyl alcohol=1/89/10 (by volume)) and TRANS-G (N) Sumi ink (manufactured by Dainippon Ink and Chemicals Inc.) were supplied as the fountain solution and ink, and 100 sheets were printed at a printing speed of 6,000 sheets per hour.

The number of sheets required until the on-press development of the unexposed area of the image-recording layer finished and the ink did not transfer to the printing paper was counted, and the number of sheets was taken as the on-press developability. Printed substance free from staining could be obtained within 100 sheets with every lithographic printing plate precursor.

3. Evaluation

In general, in the case of negative lithographic printing plate precursor, the degree of hardening of an image-recording layer (photosensitive layer) is low when the exposure amount is small, and the degree of hardening is high when the exposure amount is large. When the degree of hardening of an image-recording layer is too low, the press life of the lithographic printing plate becomes low and the reproducibility of small dots and fine lines becomes failure. On the other hand, when the degree of hardening of an image-recording layer is high, the press life becomes high and the reproducibility of small dots and fine lines becomes good.

In the invention, as shown below, the press life and fine line reproducibility of the obtained lithographic printing plate precursors 1 to 6 were evaluated on the same exposure condition as described above and the results of evaluation were taken as the criteria of the sensitivity of each lithographic printing plate precursor. That is, the more the number of printed sheets in the press life, and the finer the fine line width in the fine line reproducibility, the higher is the sensitivity of the lithographic printing plate precursor.

(1) Fine Line Reproducibility

As described above, after 100 sheets of paper were printed and confirmed that a printed matter was free from the staining of ink, 500 sheets were further printed. The fine line chart (a chart on which 10, 12, 14, 16, 18, 20, 25, 30, 35, 40, 60, 80, 100 and 200 μm fine lines were exposed) of the 600$^{th}$ of the printed substances was observed with a loupe of 25 magnifications, and fine line reproducibility was evaluated from the fine line width reproduced with the ink without cutting.

(2) Press Life

As described above, after performed printing in the evaluation of fine line reproducibility, printing was further continued. Since the image-recording layer gradually wears and ink receptive property lowers as the number of printing increases, the density of ink on the printed substance lowers. Press life was evaluated by the number of sheets printed until the time when the ink density (reflection density) lowered by 0.1 from the starting time of printing.)

(3) On-press Development Running Properties

On-press development of ten printing plates and printing (100 sheets) were repeated, and the staining of the printed substance (staining of the background of non-image area) by the mixing of the substances removed by on-press development in a fountain solution, and the accumulation of the substance on the impression cylinder were evaluated. The results obtained are shown in Table 1 below.

provided is inferior in fine line reproducibility and press life by the influence of oxygen in the air. The lithographic printing plate precursor in Comparative Example 2 provided with an overcoat layer not containing an inorganic laminar compound is inferior in on-press developability, background staining by the mixing of a large quantity of polyvinyl alcohol in the fountain solution, and accumulation on impression cylinder.

Example 5

The following undercoat layer coating solution (1) was coated on the support prepared in Example 1 in dry coating weight of 10 mg/m².

| Undercoat layer coating solution (1): | |
|---|---|
| Undercoat compound (1) | 0.017 g |
| Methanol | 9.00 g |
| Water | 1.00 g |

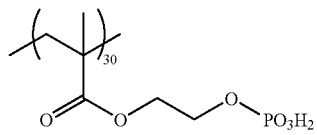
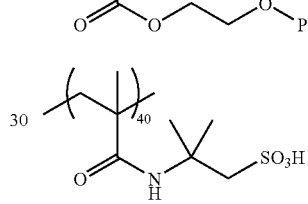
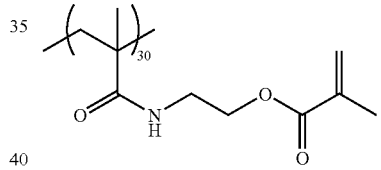

Undercoat Compound (1)

TABLE 1

| Example No. | On-Press Development (number of sheets) | Fine Line Reproducibility (μm) | Press Life (number of sheets) | On-Press Development Running Properties | |
|---|---|---|---|---|---|
| | | | | Staining of Background | Accumulation on Impression Cylinder |
| Example 1 | 20 | 12 | 15,000 | No | No |
| Example 2 | 20 | 14 | 15,000 | No | No |
| Example 3 | 25 | 12 | 17,000 | No | No |
| Example 4 | 25 | 12 | 15,000 | No | No |
| Comparative Example 1 | 30 | 80 | 2,000 | No | No |
| Comparative Example 2 | 45 | 40 | 12,000 | Background generated from 2$^{nd}$ plates | Accumulation occurred from 5$^{th}$ plate |

As is apparent from the results in Table 1, the lithographic printing plate precursors in the present invention are excellent in on-press developability, fine line reproducibility, press life and on-press development running properties. On the other hand, the lithographic printing plate precursor in Comparative Example 1 in which an overcoat layer is not In the next place, image-recording layer coating solution (3) having the composition shown below was coated on the above undercoat layer by bar coating and oven-dried at 160° C. for 60 seconds, whereby an image-recording layer having a dry coating weight of 1.0 g/m² was formed. Image-recording layer coating solution (3) was obtained by mixing the following photosensitive solution (1) and microcapsule aqueous solution (1) just before coating.

| Photosensitive solution (1): | |
|---|---|
| Binder polymer (2) shown below | 0.162 g |
| Polymerization initiator (1) shown above | 0.100 g |
| Infrared absorber (2) shown above | 0.020 g |
| Polymerizable compound Aronix M-215 (manufactured by TOA GOSEI CO., LTD.) | 0.385 g |
| Fluorine surfactant (1) shown above | 0.044 g |
| Naphthalene sulfonate of Victoria Pure Blue | 0.010 g |
| Methyl ethyl ketone | 1.091 g |
| 1-Methoxy-2-propanol | 8.609 g |
| Microcapsule aqueous solution (1): | |
| Microcapsule (1) synthesized as follows | 2.640 g |
| Water | 2.425 g |

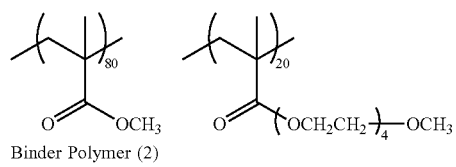

Binder Polymer (2)

Synthesis of Microcapsule (2):

As the oil phase component, 10 g of the addition product of trimethylolpropane and xylene diisocyanate (Takenate D-110N, a 75% by weight ethyl acetate solution, manufactured by Mitsui Takeda Chemicals Inc.), 6.00 g of Aronix M-215 (manufactured by TOA GOSEI CO., LTD.), and 0.12 g of Pionin A-41C (manufactured by Takemoto Oil & Fat) were dissolved in 16.67 g of ethyl acetaate. As the aqueous phase component, 37.5 g of a 4% by weight aqueous solution of polyvinyl alcohol (PVA-205, manufactured by Kuraray Co., Ltd.) was prepared. The oil phase component and the aqueous phase component were mixed, and emulsified with a homogenizer at 12,000 rpm for 10 minutes. The obtained emulsified product was added to 25 g of distilled water, stirred at room temperature for 30 minutes, and then stirred at 40° C. for 2 hours. The concentration of the solids content of the thus obtained microcapsule solution was diluted to reach 15% by weight with distilled water. The average particle size was 0.2 μm.

The overcoat layer coating solution (2) having the following composition was then coated on the image-recording layer with bar coating, and oven-dried at 100° C. for 60 seconds in an oven to form an overcoat layer having a dry coating weight of 0.1 g/m², whereby lithographic printing plate precursor 5 was obtained.

| Overcoat layer coating solution (2): | |
|---|---|
| The following mica dispersion (4) | 0.5 g |
| Polyvinyl alcohol (PVA-105, manufactured by Kuraray Co., Ltd.) | 0.06 g |
| Polyvinyl pyrrolidone | 0.006 g |
| Sodium 2-ethylhexylsulfosuccinate | 0.008 g |
| Water | 7.5 g |

Preparation of Mica Dispersion (4):

Synthetic mica ME-100 (32 g) (manufactured by CO-OP CHEMICAL CO., LTD.) was added to 368 g of water, and dispersed with a homogenizer until the average particle size became 2.5 μm (laser scattering method), whereby mica dispersion (4) was obtained.

Example 6

On a support coated with the above undercoat layer, image-recording layer coating solution (4) having the following composition was coated with bar coating, dried at 100° C. for 60 seconds in an oven to form an image-recording layer having a dry coating weight of 1.4 g/m², and then overcoat layer coating solution (1) having the composition described above was coated with bar coating in dry coating weight of 0.3 g/m², and dried at 120° C. for 1 minute, whereby lithographic printing plate precursor 6 was obtained.

| Image-forming layer coating solution (4): | |
|---|---|
| The above binder polymer (2) | 2.0 g |
| Polymerizable compound Isocyanuric acid EO-modified triacrylate (Aronix M-315, manufactured by TOA GOSEI CO., LTD.) | 1.5 g |
| The following compound (1) | 0.15 g |
| The following compound (2) | 0.20 g |
| The following compound (3) | 0.4 g |
| Ethyl Violet | 0.1 g |
| Thermal polymerization inhibitor N-Nitrosophenylhydroxylamine aluminum salt | 0.1 g |
| The above fluorine surfactant (1) | 0.02 g |
| Tetraethylamine hydrochloride | 0.06 g |
| 1-Methoxy-2-propanol | 17.5 g |
| Methyl ethyl ketone | 19.0 g |

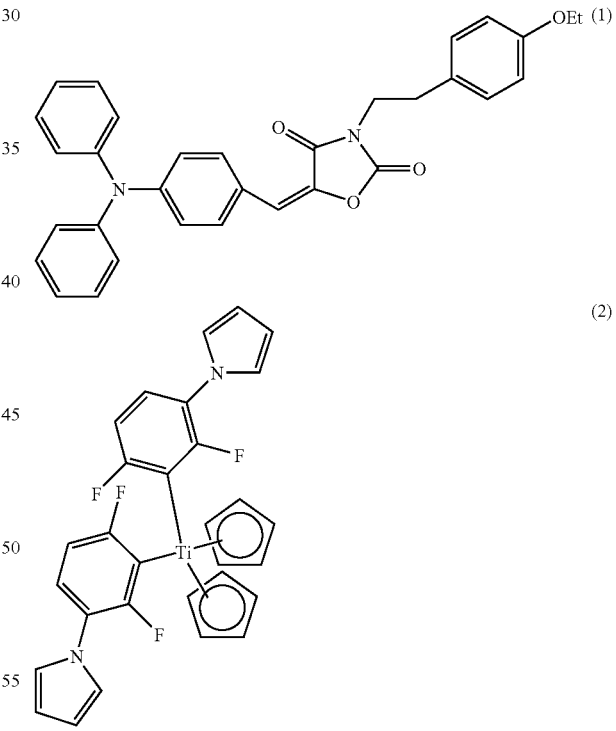

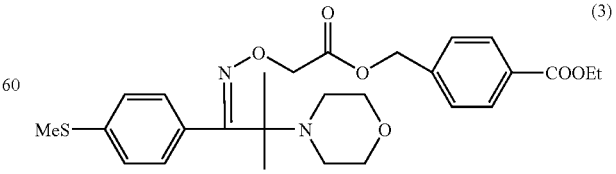

Exposure and Printing:

The obtained lithographic printing plate precursor 5 was subjected to exposure with Trendsetter 3244VX (manufactured by Creo Products Incorporated) loading a water-cooling type 40 W infrared semiconductor laser on the conditions of output of 9 W, external drum rotating speed of 210 rpm, and resolution of 2,400 dpi, so that the exposure image contained a fine line chart. Lithographic printing plate precursor 6 was subjected to imagewise exposure with a 10 mW output 405 nm semiconductor laser on the condition of energy density of 3 mJ/cm$^2$.

As a result, in Example 5, the number of the plates of on-press development was 15, fine line reproducibility was 10 μm, press life was 25,000 sheets, and background staining and accumulation on the impression cylinder were not observed in the evaluation of on-press development running properties. In Example 6, the number of the plates of on-press development was 20, fine line reproducibility was 10 μm, press life was 25,000 sheets, and background staining and accumulation on the impression cylinder were not observed in the evaluation of on-press development running properties.

The present invention can provide a lithographic printing plate precursor excellent in on-press developability, fine line reproducibility, press life and on-press development running properties.

The entire disclosure of each and every foreign patent application from which the benefit of foreign priority has been claimed in the present application is incorporated herein by reference, as if fully set forth.

What is claimed is:

1. A lithographic printing plate precursor comprising, in the following order:
    a support;
    an undercoat layer comprising a compound having a polymerizable group, an acid radical of the formula —OPO$_3$H$_2$, and a hydrophilicity-imparting group of the formula —SO$_3$H in the molecule;
    an image recording layer comprising (A) an actinic ray absorber, (B) a polymerization initiator, and (C) a polymerizable compound, wherein, when the image recording layer is imagewise exposed, a non-exposed portion of the image recording layer is removed with at least one of a printing ink and a fountain solution; and
    an overcoat layer comprising an inorganic laminar compound.

2. The lithographic printing plate precursor of claim 1, wherein the actinic ray absorber is an infrared absorber.

3. The lithographic printing plate precursor of claim 1, wherein the inorganic laminar compound is a swellable inorganic laminar compound.

4. A lithographic printing method comprising:
    mounting a lithographic printing plate precursor according to claim 1 on a printing press;
    imagewise exposing the lithographic printing plate precursor with an infrared laser beam; and then
    feeding at least one of a printing ink and a fountain solution to the lithographic printing plate precursor to remove an infrared non-exposed area in the image recording layer.

5. The lithographic printing method of claim 4, wherein the mounting is performed before the imagewise exposing.

6. The lithographic printing method of claim 4, wherein the mounting is performed after the imagewise exposing.

7. A lithographic printing method comprising:
    mounting a lithographic printing plate precursor according to claim 1 on a printing press;
    imagewise exposing the lithographic printing plate precursor with an ultraviolet laser beam having a wavelength of from 250 to 420 nm; and then
    feeding at least one of a printing ink and a fountain solution to the lithographic printing plate precursor to remove an ultraviolet non-exposed area in the image recording layer.

8. The lithographic printing method of claim 7, wherein the mounting is performed before the imagewise exposing.

9. The lithographic printing method of claim 7, wherein the mounting is performed after the imagewise exposing.

* * * * *